(12) United States Patent
Thompson et al.

(10) Patent No.: US 6,869,695 B2
(45) Date of Patent: Mar. 22, 2005

(54) WHITE LIGHT EMITTING OLEDS FROM COMBINED MONOMER AND AGGREGATE EMISSION

(75) Inventors: Mark E. Thompson, Anaheim, CA (US); Jason Brooks, Los Angeles, CA (US); Vadim Adamovich, Los Angeles, CA (US); Stephen R. Forrest, Princeton, NJ (US); Brian D'Andrade, Princeton, NJ (US)

(73) Assignees: The Trustees of Princeton University, Princeton, NJ (US); The University of Southern California, Los Angeles, CA (US)

(*) Notice: Subject to any disclaimer, the term of this patent is extended or adjusted under 35 U.S.C. 154(b) by 75 days.

(21) Appl. No.: 10/112,257

(22) Filed: Mar. 29, 2002

(65) Prior Publication Data

US 2003/0124381 A1 Jul. 3, 2003

Related U.S. Application Data

(60) Provisional application No. 60/344,133, filed on Dec. 28, 2001.

(51) Int. Cl.[7] .......................... H05B 33/14; C09K 11/06
(52) U.S. Cl. .................. 428/690; 428/917; 313/504; 313/506; 257/102; 257/103; 252/301.16; 252/301.35
(58) Field of Search ................ 428/690, 917; 313/504, 506; 252/301.16, 301.35; 257/102, 103

(56) References Cited

U.S. PATENT DOCUMENTS

| | | | |
|---|---|---|---|
| 5,703,436 A | 12/1997 | Forrest et al. | 313/506 |
| 5,707,745 A | 1/1998 | Forrest et al. | 428/432 |
| 6,013,538 A | 1/2000 | Burrows et al. | 438/22 |
| 6,097,147 A | 8/2000 | Baldo et al. | 313/506 |
| 6,303,238 B1 | 10/2001 | Thompson et al. | 428/690 |
| 6,337,102 B1 | 1/2002 | Forrest et al. | 427/64 |
| 6,420,031 B1 | 7/2002 | Parthasarathy et al. | 428/411.1 |
| 6,469,437 B1 | 10/2002 | Parthasarathy et al. | 313/504 |
| 6,521,360 B2 * | 2/2003 | Lee et al. | 428/690 |
| 6,528,188 B1 * | 3/2003 | Suzuki et al. | 428/690 |
| 6,555,253 B2 * | 4/2003 | Hamada et al. | 428/690 |
| 2001/0053462 A1 * | 12/2001 | Mishima | 428/690 |
| 2002/0025419 A1 | 2/2002 | Lee et al. | 428/212 |
| 2002/0071963 A1 | 6/2002 | Fujii | 428/690 |
| 2002/0125818 A1 * | 9/2002 | Sato et al. | 313/504 |
| 2002/0182441 A1 | 12/2002 | Lamansky et al. | 428/690 |
| 2002/0197511 A1 * | 12/2002 | D'Andrade et al. | 428/690 |

OTHER PUBLICATIONS

M. A. Baldo, et al., "Highly efficient phosphorescent emission from organic electroluminescent devices," Nature, Sep. 1998, vol. 395, pp. 151–154.

M.A. Baldo, et al., "Very high–efficiency green organic light–emitting devices based on electrophosphorescence", Applied Physics Letters, vol. 75, No. 1, pp. 4–6, Jul. 5, 1999.

(List continued on next page.)

Primary Examiner—Marie Yamnitzky
(74) Attorney, Agent, or Firm—Kenyon & Kenyon

(57) ABSTRACT

The present invention relates to efficient organic light emitting devices (OLEDs). More specifically, the present invention relates to white-emitting OLEDs, or WOLEDs. The devices of the present invention employ two emitters in a single emissive region to sufficiently cover the visible spectrum. White emission is achieved from two emitters in a single emissive region through the formation of an aggregate by one of the emissive centers. This allows the construction of simple, bright and efficient WOLEDs that exhibit a high color rendering index.

59 Claims, 19 Drawing Sheets

OTHER PUBLICATIONS

C. Adachi, et al., "High–efficiency organic electrophosphorescent devices with tris(2–phenylpyridine) iridium doped into electron–transporting materials", App. Phys. Lett., vol. 77, No. 6, pp. 904–906, (Aug. 7, 2000).

C. Adachi, et al., "High–efficiency red electrophosphorescence devices", App. Phys. Lett., vol. 78, No. 11, pp. 1622–1624 (Mar. 12, 2001).

C. Adachi, et al., "High efficiency organic light emitting diodes using electrophosphorescence", Bull. Am. Phys. Soc., Series II, vol. 46, No. 1, Part II, p. 863 (Mar. 2001).

M.A. Baldo, et al., "Excitonic singlet–triplet ratio in a semiconducting organic thin film", Phys. Rev., B vol. 60, No. 20, pp. 14422–14428 (Nov. 15, 1999).

R.H. Friend, et al., "Electroluminescence in conjugated polymers", Nature (London), vol. 397, pp. 121–128 (Jan. 14, 1999).

Y. Cao, et al., "Improved quantum efficiency for electroluminescence in semiconducting polymers", Nature (London), vol. 397, pp. 414–417 (Feb. 4, 1999).

M.A. Baldo, et al., "Transient analysis of organic electrophosphorescence: I. Transient analysis of triplet energy transfer", Phys. Rev. B vol. 62, No. 16, pp. 10958–10966 (Oct. 15, 2000).

W.E. Ford, et al., "Reversible triplet–triplet energy transfer within a covalently linked bichromophoric molecule", J. Phys. Chem., 96, pp. 2917–2920 (Apr. 1992).

A. Harriman, et al., "A ruthenium (II) tris(2,2'–bipyridine) derivative possessing a triplet lifetime of 42$\mu$s" R. Chem. Commun., pp. 735–736 (1999), (no month).

J. Kido, et al., Multilayer White Light–Emitting Organic Electroluminescent Device, *Science*, vol. 267, No. 5202, pp. 1332–1334 (Mar. 3, 1995).

M. Berggren, et al., "White light from an electroluminescent diode made from poly[3(4–octylphenyl)–2,2'–bithiophene] and an oxadiazole derivative", *J. Appl. Phys.* vol. 76, No. 11, pp. 7530–7534 (Dec. 1, 1994).

J. Feng, et al. "White light emission from exciplex using tris–(8–hydroxyquinoline)aluminum as chromaticity–tuning layer", Appl. Phys. Lett., vol. 78, No. 25, pp. 3947–3949 (Jun. 18, 2001).

Andrew Gilbert and Jim Baggott, *Essentials of Molecular Photochemistry*, 1991, Blackwell Scientific Publications Oxford, pp. 145–167, (no month).

S. Lamansky, et al., "Synthesis and characterization of phosphorescent cyclometalated iridium complexes" *Inorganic Chemistry*, 40, pp. 1704–1711 (Mar. 2001).

C. Adachi, et al., "Endothermic engergy transfer: A mechanism for generating very efficient high–energy phosphorescent emission in organic materials", *Appl. Phys. Lett.*, vol. 79, No. 13, pp. 2082–2084 (Sep. 24, 2001).

J. Kido et al., "Single–layer white light–emitting organic electroluminescent devices based on dye–dispersed poly(N–vinylcarbazole)" Appl. Phys. Lett., vol. 67, No. 16, pp. 2281–2283 (Oct. 16, 1995).

D. J. Milliron et al. "Surface oxidation activates indium tin oxide for hole injection" J. Appl. Phys., vol. 87, No. 1, pp. 572–576 (Jan. 1, 2000).

M.A. Baldo, et al., "Transient analysis of organic electrophosphorescence: II. Transient analysis of triplet–triplet annihilation" Phys. Rev. B vol. 62, No. 16, pp. 10967–10977 (Oct. 15, 2000).

L.S. Hung, et al., "Voltage reduction in organic light–emitting diodes", Appl. Phys. Lett. 78, pp. 3732–3734 (Jun. 2001).

C. Adachi, et al., "Nearly 100% internal phosphorescence efficiency in an organic light emitting device", J. Appl. Phys. 90, (Nov. 2001).

X. Jiang, et al., "White–emitting organic diode with a doped blocking layer between hole– and electron–transporting layer", J. Phys. D: Appl. Phys. 33, pp. 473–476 (Mar. 2000).

B.W. D'Andrade, et al., "Controlling exciton diffusion in multi–layer white phosphorescent organic light emitting devices", Adv. Mater., 14, pp. 147–151 (Jan. 2002).

M. Pope, et al., Electronic Processes in Organic Crystals, Oxford University Press, NY, 1982, table of contents.

N.J. Turro, Modern Molecular Photochemistry, University Science Books, Mill Valley, 1991, table of contents.

S.W. Lai, et al., "Spectroscopic properties of luminescent platinum (II) complexes containing 4,4',4"–Tri–tert–butyl–2,2':6', 2".terpyridine ((t)Bu(3)tpy)", Inorg. Chem. 38, pp. 4262–4267, (Sep. 1999).

S.W. Lai et al., "Probing d(8)–d(8) interactions in luminescent mono– and binuclear cyclometalated platinum (II) complexes of 6–phenyl–2,2'–bipyridines", Inorg. Chem. 38, pp. 4046–4055 (Sep. 1999).

P.I. Kvam, et al., "Spectroscopic and electrochemical properties of some mixed–ligand cyclometalated platinum (II) complexes derived from 2–phenylpyridine", Acta. Chem. Scand. 49, pp. 335–343 (1995), (no month).

N. Tessler, et al., "Current heating in polymer light emitting diodes", Appl. Phys. Lett. 73, pp. 732–734 (Aug. 1998).

J. Thompson, et al., "White light emission from blends of blue–emitting organic molecules: A general route to the white organic light–emitting diode", Applied Physics Letters, vol. 79, No. 5, pp. 560–562, Jul. 30, 2001.

C. Chao, et al., "White light emission from exciplex in a bilayer device with two blue light–emitting polymers", Applied Physics Letters, vol. 73, No. 4, pp. 426–428, Jul. 27, 1998.

\* cited by examiner

| Film | Host | Dopant 1 | Dopant 2 | CIE |
|---|---|---|---|---|
| 1 | CBP | – | – | (0.16,0.04) |
| 2 | CBP | <1 wt% FPt(acac) | – | (0.22,0.35) |
| 3 | CBP | ~7 wt% FPt(acac) | – | (0.42,0.50) |
| 4 | CBP | 6 wt% FPt(acac) | 6 wt% FIr(pic) | (0.33,0.44) |

FPt　　　　　FPt2　　　　　FPt3　　　　　FPt4

Ir(ppz)₃　　　　FIr(pic)

US 6,869,695 B2

WHITE LIGHT EMITTING OLEDS FROM COMBINED MONOMER AND AGGREGATE EMISSION

RELATED APPLICATION

The present application claims the benefit, under 35 U.S.C. §119(e) of U.S. Provisional Application No. 60/344,133, filed on Dec. 28, 2001.

GOVERNMENT RIGHTS

This invention was made with Government support under Contract No. F33615-94-1-1414 awarded by DARPA. The government has certain rights in this invention.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to efficient organic light emitting devices (OLEDs). More specifically, the present invention relates to white-emitting OLEDs, or WOLEDs. The devices of the present invention employ two emitters in a single emissive region to sufficiently cover the visible spectrum. White emission is achieved from two emitters in a single emissive region through the formation of an aggregate by one of the emissive centers. This allows the construction of simple, bright and efficient WOLEDs that exhibit a high color rendering index.

BACKGROUND OF THE INVENTION

Organic light emitting devices (OLEDs), which make use of thin film materials that emit light when excited by electric current, are expected to become an increasingly popular form of flat panel display technology. This is because OLEDs have a wide variety of potential applications, including cell phones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs), which currently dominate the growing $40 billion annual electronic display market. Due to their high luminous efficiencies, electrophosphorescent OLEDs are seen as having the potential to replace incandescent, and perhaps even fluorescent, lamps for certain types of applications.

Devices whose structure is based upon the use of layers of organic optoelectronic materials generally rely on a common mechanism leading to optical emission. Typically, this mechanism is based upon the radiative recombination of a trapped charge. Specifically, OLEDs are comprised of at least two thin organic layers between an anode and a cathode. The material of one of these layers is specifically chosen based on the material's ability to transport holes, a "hole transporting layer" (HTL), and the material of the other layer is specifically selected according to its ability to transport electrons, an "electron transporting layer" (ETL). With such a construction, the device can be viewed as a diode with a forward bias when the potential applied to the anode is higher than the potential applied to the cathode. Under these bias conditions, the anode injects holes (positive charge carriers) into the HTL, while the cathode injects electrons into the ETL. The portion of the luminescent medium adjacent to the anode thus forms a hole injecting and transporting zone, while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. These excitons are trapped in the material which has the lowest HOMO-LUMO energy gap. Recombination of the short-lived excitons may be visualized as an electron dropping from the lowest unoccupied molecular orbital (LUMO) to the highest occupied molecular orbital (HOMO), with relaxation occurring, under certain conditions, preferentially via a photoemissive mechanism.

The materials that function as the ETL or HTL of an OLED may also serve as the medium in which exciton formation and electroluminescent emission occur. Such OLEDs are referred to as having a "single heterostructure" (SH). Alternatively, the electroluminescent material may be present in a separate emissive layer between the HTL and the ETL in what is referred to as a "double heterostructure" (DH).

In a single heterostructure OLED, either holes are injected from the HTL into the ETL where they combine with electrons to form excitons, or electrons are injected from the ETL into the HTL where they combine with holes to form excitons. Because excitons are trapped in the material having the lowest energy gap, and commonly used ETL materials generally have smaller energy gaps than commonly used HTL materials, the emissive layer of a single heterostructure device is typically the ETL. In such an OLED, the materials used for the ETL and HTL should be chosen such that holes can be injected efficiently from the HTL into the ETL. Also, the best OLEDs are believed to have good energy level alignment between the HOMO levels of the HTL and ETL materials.

In a double heterostructure OLED, holes are injected from the HTL and electrons are injected from the ETL into the separate emissive layer, where the holes and electrons combine to form excitons.

Light emission from OLEDs has typically been via fluorescence, however OLED emission via phosphorescence has been recently demonstrated. As used herein, the term "phosphorescence" refers to emission from a triplet excited state of an organic molecule and the term "fluorescence" refers to emission from a singlet excited state of an organic molecule. The term luminescence refers to either fluorescent or phosphorescent emission.

Successful utilization of phosphorescence holds enormous promise for organic electroluminescent devices. For example, an advantage of phosphorescence is that potentially all excitons formed by the recombination of holes and electrons, either as a singlet or triplet excited state, may participate in luminescence. This is because the lowest singlet excited state of an organic molecule is typically at a slightly higher energy than the lowest triplet excited state. For example, in typical phosphorescent organometallic compounds, the lowest singlet excited state may rapidly decay to the lowest triplet excited state, from which the phosphorescence is produced. In contrast, only a small percentage (about 25%) of excitons in fluorescent devices are capable of producing the fluorescent luminescence that is obtained from a singlet excited state. The remaining excitons in a fluorescent device, which are produced in the lowest triplet excited state, are typically not capable of being converted into the higher energy singlet excited states from which the fluorescence is produced. This energy, thus, becomes lost to decay processes that heat-up the device rather than emit visible light.

Typically, phosphorescent emission from organic molecules is less common than fluorescent emission. However, phosphorescence can be observed from organic molecules under an appropriate set of conditions. Organic molecules coordinated to lanthanide elements often emit from excited states localized on the lanthanide metal. Such radiative emission is not from a triplet excited state. Furthermore, such emission has not been shown to be capable of producing efficiencies high enough to be of practical value in anticipated OLED applications. The europium diketonate complexes illustrate one group of these types of species.

Organic phosphorescence may be observed in molecules containing heteroatoms with unshared pairs of electrons but, typically, only at very low temperatures. Benzophenone and 2,2'-bipyridine are such molecules. Phosphorescence can be enhanced over fluorescence at room temperature by confining, preferably through bonding, the organic molecule in close proximity to an atom of high atomic number. This phenomenon, called the heavy atom effect, is created by a mechanism known as spin-orbit coupling. A related phosphorescent transition is a metal-to-ligand charge transfer (MLCT) that is observed in molecules such as tris(2-phenylpyridine)iridium(III).

The realization of highly efficient blue, green and red electrophosphorescence is a requirement for fall color display applications with low power consumption. Recently, high-efficiency green and red organic electrophosphorescent devices have been demonstrated which harvest both singlet and triplet excitons, leading to internal quantum efficiencies ($\eta_{int}$) approaching 100%. See Baldo, M. A., O'Brien, D. F., You, Y., Shoustikov, A., Sibley, S., Thompson, M. E., and Forrest, S. R., *Nature* (London), 395, 151–154 (1998); Baldo, M. A., Lamansky, S., Burrows, P. E., Thompson, M. E., and Forrest, S. R., *Appl. Phys. Lett.,* 75, 4–6 (1999); Adachi, C., Baldo, M. A., and Forrest, S. R., *App. Phys. Lett.,* 77, 904–906, (2000); Adachi, C., Lamansky, S., Baldo, M. A., Kwong, R. C., Thompson, M. E., and Forrest, S. R., *App. Phys. Lett.,* 78, 1622–1624 (2001); and Adachi, C., Baldo, M. A., Thompson, M. E., and Forrest, S. R., *Bull. Am. Phys. Soc.,* 46, 863 (2001). Using a green phosphorescent material, fac tris(2-phenylpyridine)iridium (Ir(ppy)$_3$), in particular, an external quantum efficiency ($\eta_{ext}$) of (17.6±0.5)% corresponding to an internal quantum efficiency of >85%, was realized using a wide energy gap host material, 3-phenyl-4-(1'-naphthyl)-5-phenyl-1,2,4-triazole (TAZ). See Adachi, C., Baldo, M. A., Thompson, M. E., and Forrest, S. R., *Bull. Am. Phys. Soc.,* 46, 863 (2001). More recently, high-efficiency ($\eta_{ext}$=(7.0±0.5)%) red electrophosphorescence was demonstrated employing bis(2-(2'-benzo[4,5-a]thienyl)pyridinato-N, C$^3$) iridium (acetylacetonate) [Btp$_2$Ir(acac)]. See Adachi, C., Lamansky, S., Baldo, M. A., Kwong, R. C., Thompson, M. E., and Forrest, S. R., *App. Phys. Lett.,* 78, 1622–1624 (2001).

In each of these latter cases, high efficiencies are obtained by energy transfer from both the host singlet and triplet states to the phosphor triplet, or via direct trapping of charge on the phosphorescent material, thereby harvesting up to 100% of the excited states. This is a significant improvement over what can be expected using fluorescence in either small molecule or polymer organic light emitting devices (OLEDs). See Baldo, M. A., O'Brien, D. F., Thompson, M. E., and Forrest, S. R., Phys. Rev., B 60, 14422–14428 (1999); Friend, R. H., Gymer, R. W., Holmes, A. B., Burroughes, J. H., Marks, R. N., Taliani, C., Bradley, D. D. C., Dos Santos, D. A., Bredas, J. L., Logdlund, M., Salaneck, W. R., *Nature* (London), 397, 121–128 (1999); and Cao, Y, Parker, I. D., Yu, G., Zhang, C., and Heeger, A. J., *Nature* (London), 397, 414–417 (1999). In either case, these transfers entail a resonant, exothermic process. As the triplet energy of the phosphorescent material increases, it becomes less likely to find an appropriate host with a suitably high energy triplet state. See Baldo, M. A., and Forrest, S. R., Phys. Rev. B 62,10958–10966 (2000). The very large excitonic energies required of the host also suggest that the host material may not have appropriate energy level alignments with other materials used in an OLED structure, hence resulting in a further reduction in efficiency. To eliminate this competition between the conductive and energy transfer properties of the host, a route to efficient blue electrophosphorescence may involve the endothermic energy transfer from a near resonant excited state of the host to the higher triplet energy of the phosphorescent material. See Baldo, M. A., and Forrest, S. R., Phys. Rev. B 62,10958–10966 (2000); Ford, W. E., Rodgers, M. A. J., J. Phys. Chem., 96, 2917–2920 (1992); and Harriman, A.; Hissler, M.; Khatyr, A.; Ziessel, R. *Chem. Commun.,* 735–736 (1999). Provided that the energy required in the transfer is not significantly greater than the thermal energy, this process may be very efficient.

The quality of white illumination sources can be fully described by a simple set of parameters. The color of the light source is given by its CIE chromaticity coordinates x and y. The CIE coordinates are typically represented on a two dimensional plot. Monochromatic colors fall on the perimeter of the horseshoe shaped curve starting with blue in the lower left, running through the colors of the spectrum in a clockwise direction to red in the lower right. The CIE coordinates of a light source of given energy and spectral shape will fall within the area of the curve. Summing light at all wavelengths uniformly gives the white or neutral point, found at the center of the diagram (CIE x,y-coordinates, 0.33, 0.33). Mixing light from two or more sources gives light whose color is represented by the intensity weighted average of the CIE coordinates of the independent sources. Thus, mixing light from two or more sources can be used to generate white light. While the two component and three component white light sources will appear identical to an observer (CIE x,y-coordinates, 0.32,0.32), they will not be equivalent illumination sources. When considering the use of these white light sources for illumination, the CIE color rendering index (CRI) needs to be considered in addition to the CIE coordinates of the source. The CRI gives an indication of how well the light source will render colors of objects it illuminates. A perfect match of a given source to the standard illuminant gives a CRI of 100. Though a CRI value of at least 70 may be acceptable for certain applications, a preferred white light source will have a CRI of about 80 or higher.

The most successful approaches used to generate white OLEDs described previously involve separating three different emitters (luminescent dopants) into individual layers. Three emissive centers are needed to achieve good color rendering index (CRI) values, as the lines are typically not broad enough to cover the entire visible spectrum with fewer than three emitters. One approach to the design of WOLEDs involves segregating the individual dopants into separate layers. The emissive zone in such a device is thus composed of distinct emissive layers. Kido, J. et. al. *Science,* 267, 1332–1334 (1995). The design of such a device can be complicated, since careful control of the thickness and composition of each layer is critical for achieving good color balance. The separation of emitters into individual layers is essential to prevent energy transfer between the red, green and blue emitters. The problem is that the highest energy emitter (blue) will efficiently transfer its exciton to the green and red emitters. The efficiency of this energy transfer process is described by the Forster energy transfer equations. If the blue emitter has good spectral overlap with the absorption spectra of the green or red emitters, and the oscillator strengths are high for all of the transitions, the energy transfer process will be efficient. These energy transfers can occur over distances of 30 Å or more. Likewise the green emitter will readily transfer its exciton to the red emitter. The end result is that the red emitter dominates the spectral composition if the three are doped into the film at equal concentrations. With fluorescent dyes the exciton migration lengths are comparatively short and the balance between the three emission colors can be controlled by varying the dopant ratios (more blue is needed than green and more green than red to achieve equal intensity at all three colors). If the dopant concentration is kept low the average distance between dopants can be kept below the Forster energy transfer distance and the affects of energy transfer can be minimized. Having all three dyes within a single layer involves a four component film, with each dopant present at <1%. The preparation of such a film is difficult to carry-out reliably. Any shift in dopant ratio will severely affect the color quality of the device.

The situation with phosphorescent emitters is somewhat different. While the Forster radii of phosphorescent dopants may be lower than for fluorescent dopants, the exciton diffusion lengths can be >1000 Å. In order to achieve high efficiency with electrophosphorescent devices, the phosphorescent materials generally need to be present at much higher concentrations than for fluorescent dopants (typically >6%). The end result is that mixing the phosphorescent materials together in a single layer leads to a severe energy transfer problem, just as observed for fluorescent emitters. The approach that has been used successfully segregates the phosphorescent materials into separate layers, eliminating the energy transfer problem.

SUMMARY OF THE INVENTION

The present invention is directed to efficient organic light emitting devices (OLEDs). More specifically, the present invention is directed to white-emitting OLEDs, or WOLEDs. The devices of the present invention employ two luminescent emitters, or lumophores, in a single emissive region to sufficiently cover the visible spectrum. The lumophores may emit via fluorescence (from singlet excited states) or via phosphorescence (from triplet excited states). White emission is achieved from two luminescent emitters in a single emissive region through the formation of an aggregate by one of the lumophores. The two emissive centers (the aggregate emitter and the monomer emitter) are doped into a single emissive layer. This allows the construction of simple, bright and efficient WOLEDs that exhibit a high color rendering index.

Thus, an object of the present invention is to produce white light emitting OLEDs that exhibit high external emission efficiency ($\eta_{ext}$) and luminance.

Another object of the invention is to produce white-light-emitting OLEDs that exhibit a high color rendering index.

Yet another object of the invention is to produce white-light-emitting organic light emitting devices that produce white emission having CIE x,y-chromaticity coordinates approaching (0.33, 0.33).

Yet another object of the invention is to provide OLEDs that may be used for large area, efficient light sources in diffuse-illumination applications, such as are now ubiquitously filled with conventional fluorescent lamps.

For example, an object of the invention is to produce white light emitting OLEDs comprising an emissive region, wherein the emissive region comprises an aggregate emitter, and a monomer emitter, wherein the emission from the aggregate emitter is lower in energy than the emission from the monomer emitter, and wherein the combined emission spectrum of the aggregate emitter and the monomer emitter sufficiently spans the visible spectrum to give a white emission.

BRIEF DESCRIPTION OF THE FIGURES

For the purpose of illustrating the invention, representative embodiments are shown in the accompanying figures, it being understood that the invention is not intended to be limited to the precise arrangements and instrumentalities shown.

DETAILED DESCRIPTION OF THE PREFERRED EMBODIMENTS

Figure 1:
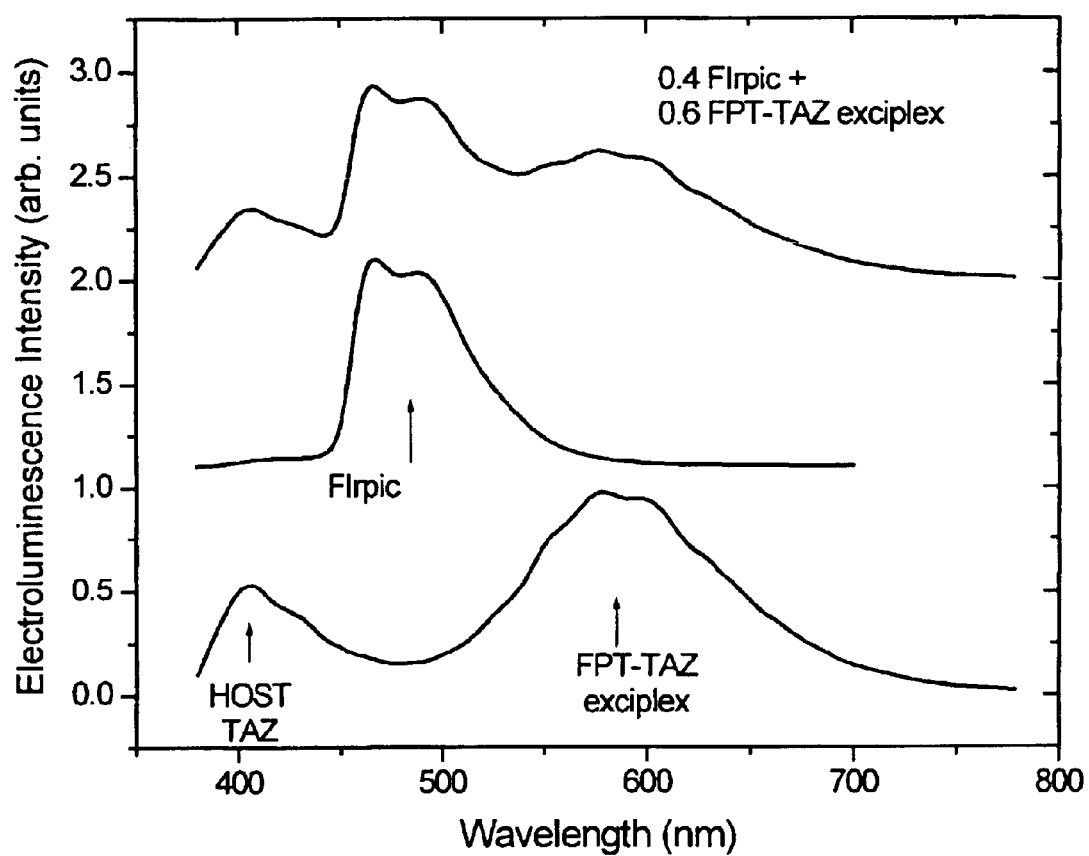
FIG. 1 shows the electroluminescence spectra of FPt in TAZ (exciplex) and FIrpic in CBP (dopant only), along with the sum of the two spectra. The summed spectrum is not a single device, but arithmetically combines the output from two devices to illustrate the potential for using monomer and exciplex emitter to achieve true white emission.
Figure 2:
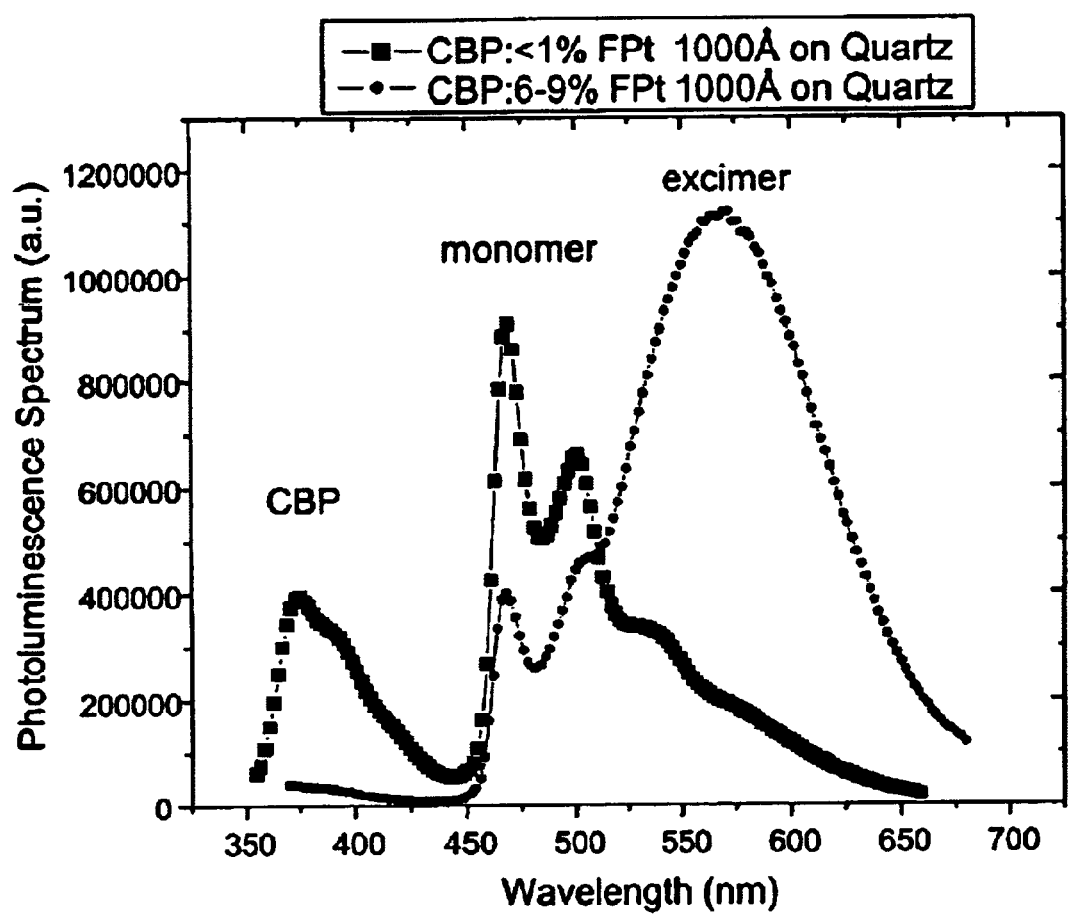
FIG. 2 shows the photoluminescence spectra of CBP films doped with <1% and >6% FPt. At 1% loading, the spectrum is dominated by monomer emission. At 6% loading, the monomer signal is still present, but is a minor component relative to the yellow, excimer emission.
Figure 3:
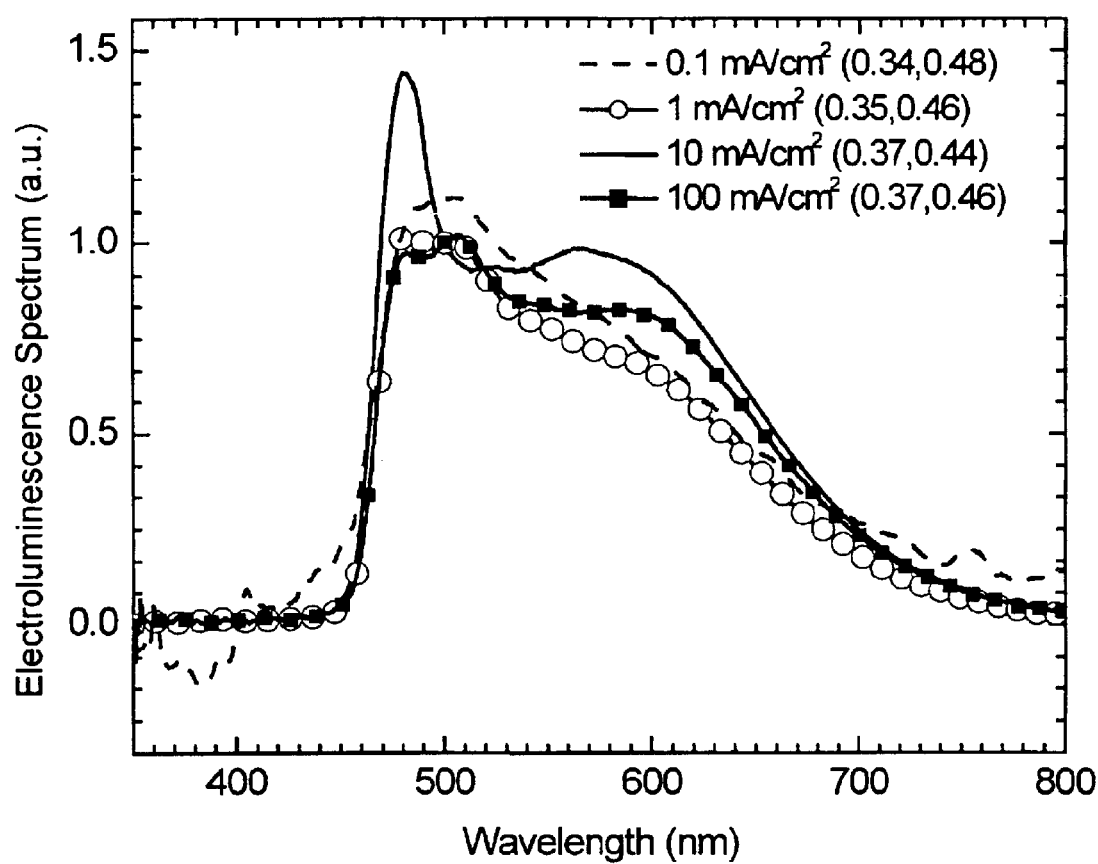
FIG. 3 shows the EL spectra at several different current levels for the device ITO/PEDOT(400)/NPD(300)/CBP:FIrpic 6%: FPt 6%(300)/FIrpic(500)/LiF(5)/Al (1000). The CIE coordinates for each of the spectra are given in the legend. The device appears white at all current densities, with CRI values as high as 70.
Figure 4:
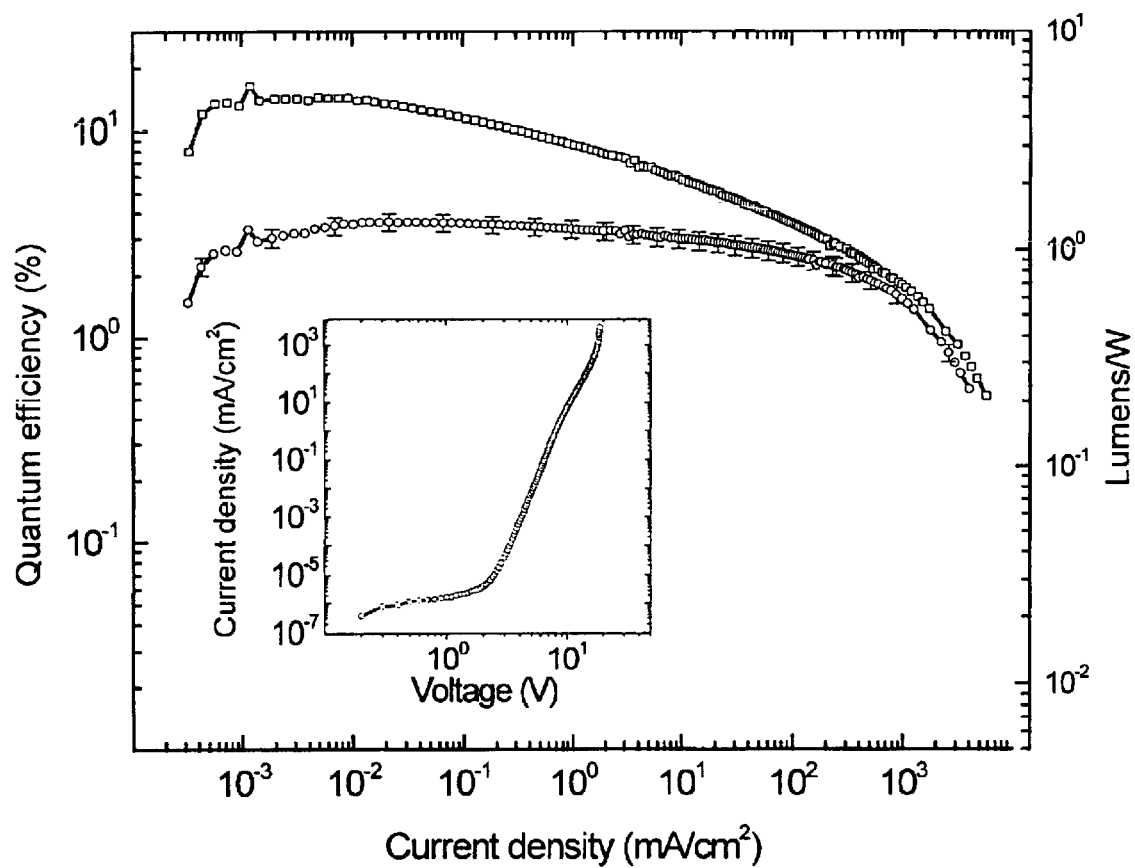
FIG. 4 shows the quantum efficiency (open circles) and power efficiency (open squares) plot for the device ITO/PEDOT(400)/NPD(300)/CBP:FIrpic 6%:FPt 6%(300)/FIrpic(500)/LiF(5)/Al (1000). The current density-voltage plot is shown in the insert. This device demonstrates that excimer emission can be coupled with monomer no emission in a single OLED to achieve white light emission.

The present invention will now be described in detail for specific preferred embodiments of the invention. These embodiments are intended only as illustrative examples and the invention is not to be limited thereto.

The present invention is directed to producing efficient, white emitting OLEDs. The devices of the present invention employ two emitters in a single emissive region to sufficiently cover the visible spectrum. White emission is achieved from two luminescent emitters in a single emissive region through the formation of an aggregate by one of the lumophores. The aggregate emitter comprises two or more emissive molecules or moieties that are bound in the ground state and/or in the excited state. Generally, the aggregate emitter will be composed of two emissive molecules (i.e., a dimer), which may be alike or different. The lumophores may emit via fluorescence (from singlet excited states) or via phosphorescence (from triplet excited states). The two emissive centers (the aggregate emitter and the monomer emitter) are doped into a single emissive layer. This allows the construction of simple, bright and efficient WOLEDs that exhibit a high color rendering index. Among methods for producing white light, electrophosphorescence is preferred as the most effective mechanism for OLED light emission due to its demonstrated potential for achieving 100% internal quantum efficiency. Surprisingly, we have found that the phosphorescent emission from the aggregate excited state is often greater than would be expected, even given the potential for achieving 100% internal quantum efficiency. While electrophosphorescence, typically achieved by doping an organometallic phosphorescent material into a conductive host, has successfully been used to generate the primary colors necessary for display applications, efficient generation of the broad spectral emission required of a white light source had, until now, remained elusive.

While separating the emitting materials into separate layers may make the color tuning of a three dopant electroluminescent devices a relatively straightforward process, such as disclosed in co-pending Application No. 60/291,496, entitled "High Efficiency Multi-color Electrophosphorescent OLEDs", filed May 16, 2001, the multiple layer approach adds complication to the device. It would be much simpler if devices could be made with two emitters rather than three and if the two emitters could be present in the same emissive region. If that were the case, devices might be fabricated in the same high efficiency, long lived structures that have been demonstrated for monochromatic electroluminescent OLEDs. In order to use only two dopants and get an acceptable CRI value, one of the dopants must have a very broad emission line. Unfortunately, broad emission lines had been typically observed only in inefficient devices.

A promising approach to reducing the number of dopants and structural heterogeneities inherent in the multiple colorband architecture is to employ a lumophore that forms a broadly emitting exciplex (i.e. a state whose wavefunction overlaps a neighboring, dissimilar molecule) in its excited state. Recently, fluorescent exciplex OLEDs have been demonstrated with Commission Internationale de l'Eclairage (CIE) coordinates close to the ideal white light source of (0.33,0.33), and an external efficiency of $\eta_{ext}=0.3\%$, a luminance efficiency of $\eta_p=0.58$ lm/W and a maximum luminance of 2000 $cd/m^2$. See Berggren, M. et al. *J. Appl. Phys.* 76, 7530–7534 (1994); and Feng, J. et al. *Appl. Phys. Lett.* 78, 3947–3949 (2001). These values lie well below those needed in practical lighting applications. The emission from such OLEDs was reported to be produced solely by exciplexes.

We have found that the solution to achieving an efficient white emitting OLED involves obtaining emission from two luminescent emitters in a single emissive region, wherein one of the emissive centers is a monomer and the other emissive center is an aggregate. The aggregate emitter comprises two or more lumophores that are bound in the ground state and/or in the excited state. Generally, the aggregate emitter will be composed of two molecules (i.e., a dimer), which may be alike or different.

An excimer or exciplex is formed when the lumophores comprising the aggregate emitter are bound in the excited state but not bound in the ground state. An excimer is a dimer with an excited state wavefunction that extends over two identical molecules. An exciplex is a dimer with an excited state wavefunction that extends over two dissimilar molecules. In excimers and exciplexes, the constituent molecules are bound together in the excited (excitonic) state, but rapidly dissociate to two discrete molecules after relaxation. The end result is that the exciton has no absorption in the ground state. Excimer and exciplex formation is favored where there is a significant overlap between the LUMOs of the constituent species. The excimer and exciplex energy is lower than that of an exciton localized on either of the two molecules that make it up and it's emission is typically a broad line. Since excimers and exciplexes both lack a bound ground state, they provide a unique solution to the achievement of efficient energy transfer from the charge-carrying host matrix to the light emitting centers. Indeed, for the case of two emitting centers, use of an excimer or exciplex prohibits energy transfer between the emitting centers, eliminating complicated intermolecular interactions, which make color balancing using multiple dopants problematic. For a review of the properties of excimers and excitons see Andrew Gilbert and Jim Baggott, *Essentials of Molecular Photochemistry,* 1991, CRC Press, Boston, pp. 145–167.

In another embodiment of the invention, the molecules that comprise the aggregate emitter are bound in both the ground state and in the excited state. For example, a dimer of the phosphorescent organometallic compound may have a metal—metal bond in the ground state. Practically, it can be difficult to determine whether the lumophores comprising the aggregate emitter are bound in the ground state or not, when doped into molecular thin films, of the type used for the fabrication of OLEDs. It may be the case for some aggregate emitters that the truth is somewhere between the extremes. For example, a dimer of the phosphorescent organometallic compound may have a weak metal—metal bond in the ground state, but in the excited state the bond shortens and the dimer becomes strongly bound. In this case, the dimer is not an excimer or an exciplex, as the dimer is bound in the ground state. The phosphorescent dopants may well be involved in both $\pi$-$\pi$ stacking and metal—metal interactions in the doped films, leading to either excimer or MMLCT excited states. Thus, emission from these films may have contributions from both excimeric and oligomeric excited states. In either case, the emission spectra observed from the aggregate, whether bound in the ground state or not, are typically broad and unstructured, occurring at lower energy than that of the monomer. Thus, the term "excimer" or "exciplex" as used herein may in some cases refer to aggregates having strongly bound excited states and weakly bound ground states. Additionally, the term "aggregate" as used herein includes excimers and exciplexes as conventionally understood.

In one embodiment of the invention, both monomer and aggregate emission are achieved from the same dopant. Those dopant molecules that are in relatively close contact with another dopant molecule will be able to form the aggregate state. Dopant molecules that are isolated will give monomer and not aggregate emission. A white OLED may result, if the relative contribution from each emissive center is appropriately controlled, for example, by adjusting the concentration of each emitter in the emissive layer. To achieve well balanced monomer and aggregate emission from an emissive layer with a single luminescent dopant and achieve high efficiencies the monomer-aggregate ratio must be achieved at an appropriate concentration of the dopant. Different approaches that affect the nature of intermolecular interactions in the film, and thus the degree of monomer-aggregate emission may be used to control the monomer-aggregate emission ratio. One such approach is to vary the amount of steric bulk in the dopant molecule or to change the host matrix.

Using such methods, it is a particular feature of the present invention that WOLEDs can be fabricated with both a very high efficiency and a very high CRI by adjusting the concentration of the dopant so as to be substantially the same throughout the emissive layer. Naturally occurring variations in the distance between neighboring molecules determines the extent of aggregate formation for a given host-dopant combination, such that the desired balance of monomer and aggregate emission is achieved. The emission spectrum produced by the devices of the present invention sufficiently span the visible spectrum so as to appear substantially white, for example, a CIE x-coordinate of about 0.30 to about 0.40 in combination with a CIE y-coordinate of about 0.30 to about 0.45. Preferably the CIE x,y-coordinates are about (0.33, 0.33). Moreover, the devices of the present invention are preferably capable of producing white emission having a CIE (Commission Internationale de l'Eclairage) color rendering index (CRI) of at least about 70. More preferably, the CRI is higher than about 80. Alternatively, instead of seeking a very high CRI, the method might be used to produce a selected color having prescribed CIE coordinates.

The devices of the present invention are comprised of an anode, an HTL, an ETL and a cathode. In addition, the device may contain additional layers, such as, but not limited to, an exciton blocking layer (EBL), a separate emissive layer, or a hole injection layer (HIL). In one embodiment, the HTL will also serve as the region in which exciton formation and electroluminescent emission occur. Alternatively, the ETL may serve as the region in which exciton formation and electroluminescent emission occur. In yet another embodiment, the device may comprise a separate emissive layer in which exciton formation and electroluminescent emission occur. The emissive region comprises two types of emissive centers. One of the emissive centers will form an aggregate to give a broad emission spectrum. The other emitter will emit as a monomer. In one embodiment of the invention, a single luminescent material can emit as both the aggregate emitter and as the monomer emitter. Color optimization leading to a high color rendering index may be achieved by selection of the aggregate forming emitter and the monomer emitter so that their emissions cover the visible spectrum and by varying the concentrations of the emitters.

In a preferred embodiment, the two luminescent materials are doped into a matrix material. The matrix material will typically be a charge carrying material. In a particularly preferred embodiment, the luminescent materials will be phosphorescent emitters (i.e., they will emit from triplet excited states). Materials that are present as charge-carrying host and dopant are selected so as to have a high level of energy transfer from the host to the dopant material. High efficiencies are obtained by energy transfer from both the host singlet and triplet states to the phosphor triplet, or via direct trapping of charge on the phosphorescent material, thereby harvesting up to 100% of the excited states. In addition, these materials need to be capable of producing acceptable electrical properties for the OLED. Furthermore, such host and dopant materials are preferably capable of being incorporated into the OLED using starting materials that can be readily incorporated into the OLED by using convenient fabrication techniques. For example, small molecule, non-polymeric materials, may be deposited by using line-of-sight vacuum-deposition techniques, or by using an organic vapor phase deposition (OVPD) technique such as disclosed in application Ser. No. 08/972,156, filed Nov. 17, 1997 and entitled "Low Pressure Vapor Phase Deposition Of Organic Thin Films", which is incorporated herein in its entirety by reference. Alternatively, polymeric materials may be deposited using spin-coating techniques.

In a preferred embodiment of the present invention, the emissive region of the device will be comprised of an excimer and a monomer emitter. The luminescent materials that comprise the monomer and excimer may emit via fluorescence or phosphorescence. The monomer emitter will preferably be one that emits in the high energy (for example, blue or green) portion of the visible spectrum. The excimer emitter preferably provides a broad emission which spans the low energy portion of the visible spectrum. There is no absorption into this excimer state, so there will be minimal energy transfer from the monomeric emitter to the excimer.

To achieve efficient excimer emission from a doped layer, control of the dopant concentration is an important consideration. Excimers will typically form when planar molecules are in close proximity to each other. For example, square planar metal complexes, such as certain complexes of Pt, have been demonstrated to form excimers in concentrated solutions and in thin films. For example, FPt(acac) shows monomer emission in $10^{-6}$ M solutions of dichloromethane and excimer emission in concentrated $10^{-3}$ M solutions.

At appropriate concentrations, it is possible to get both monomer and excimer emission from the same dopant. Only those dopant molecules that are in relatively close contact with another dopant molecule will be able to form the excimer state. Dopant molecules that are isolated will give monomer and not excimer emission. If the monomer is blue emitting and the excimer is yellow emitting, a white OLED may result, if the relative contribution from each emitter is appropriately controlled, for example, by adjusting the concentration of each emitter in the emissive layer.

Forming excimer states requires that the two emissive molecules be in close proximity to each other, so that they can dimerize when one of them is promoted to its excited state. This suggests that there should be a strong concentration dependence in excimer formation. For example, when FPt is doped into a host matrix, such as CBP, at 1%, only monomer emission is observed in the photoluminescence spectrum of the thin film. At this low doping level, the molecules are isolated. As the doping concentration is raised, the amount of excimer emission increases as the monomer line decreases. At FPt doping levels of 2–3%, the ratio of monomer to excimer emission is close to 1:1. At this doping level, some of the FPt molecules are isolated and others are in close proximity to another FPt molecule, leading to efficient excimer formation. At a doping level of 6% nearly complete excimer emission is observed.

If an OLED is prepared with the FPt film doped at about 2–3%, it should be possible to prepare a white OLED. This device has only a single dopant, present in a homogeneously doped thin film Unfortunately, a doping level of about 2–3% is generally too low to efficiently quench the host excitons, resulting in significant host emission in the electroluminescence spectrum. In order to make efficient phosphorescent OLEDs, the doping level is preferably above about 6%, with the highest efficiencies at higher doping levels. At doping levels high enough to prepare efficient OLEDs, only excimer emission is observed for FPt. In order to achieve more efficient white emission from a single dopant (via simultaneous monomer and excimer emission) the doping level leading to balanced emission should be increased.

Figure 9:
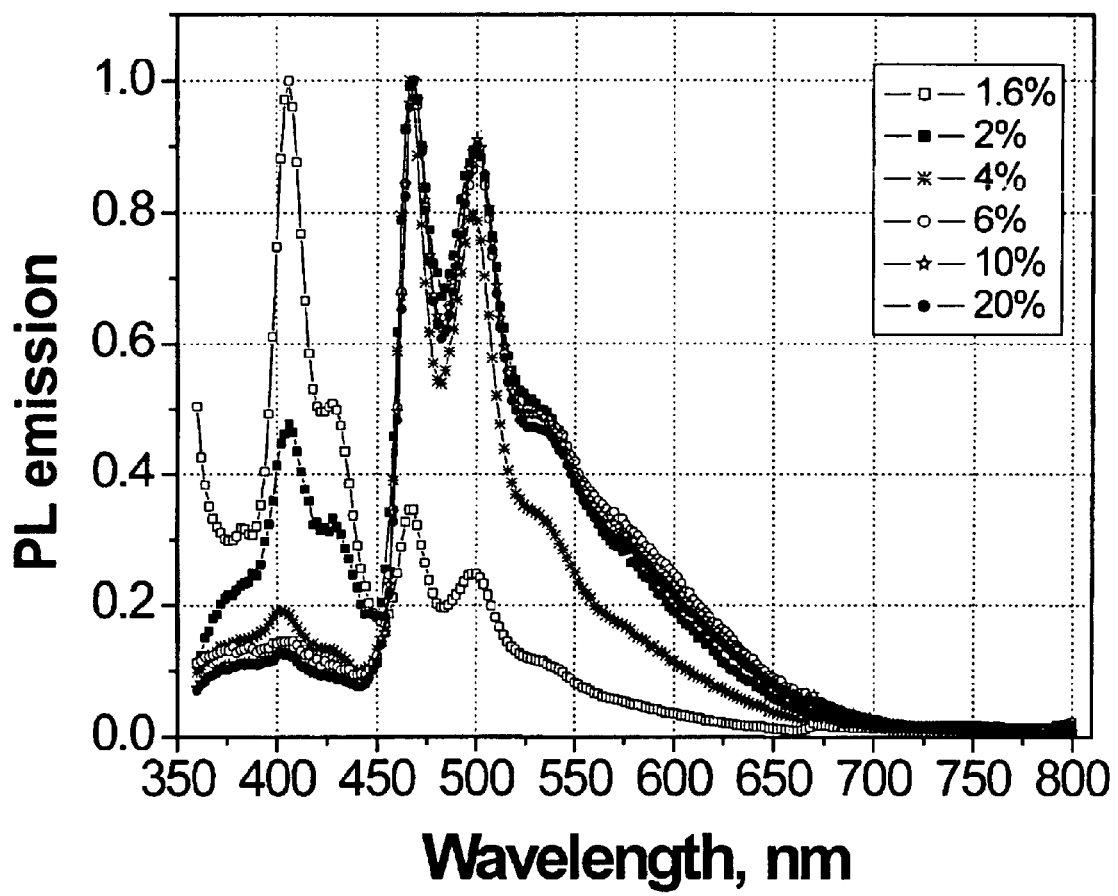
FIG. 9 shows the photoluminescence spectra of CBP films doped with varying levels of FPt2.
Figure 10:
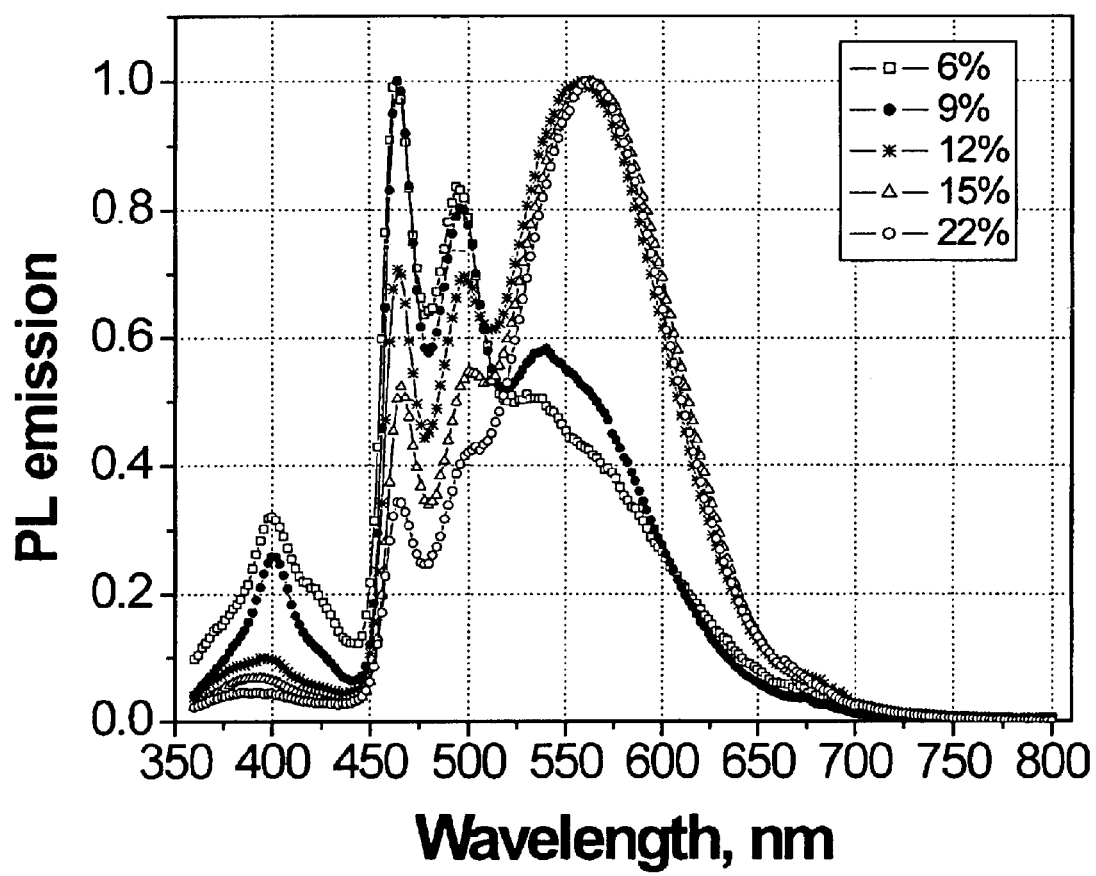
FIG. 10 shows the photoluminescence spectra of CBP films doped with varying levels of FPt3.
Figure 11:
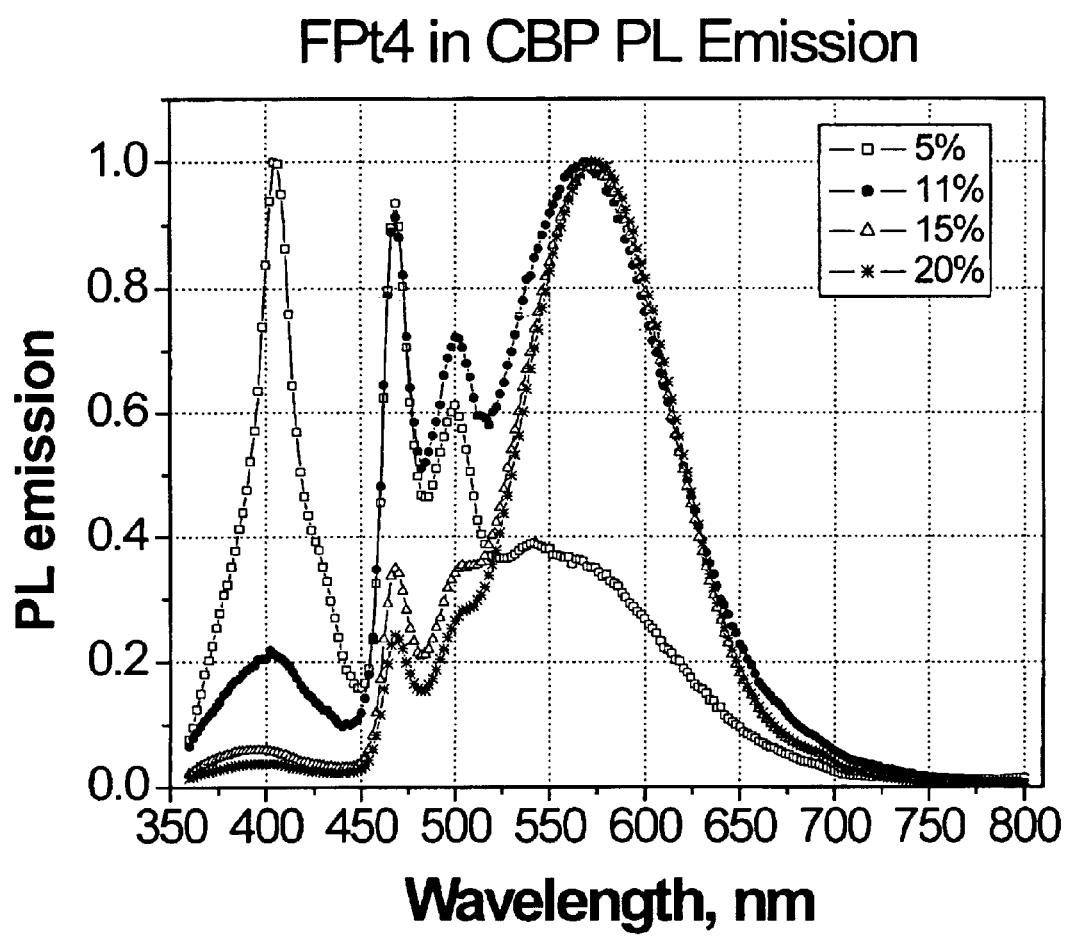
FIG. 11 shows the photoluminescence spectra of CBP films doped with varying levels of FPt4.
Figure 12:
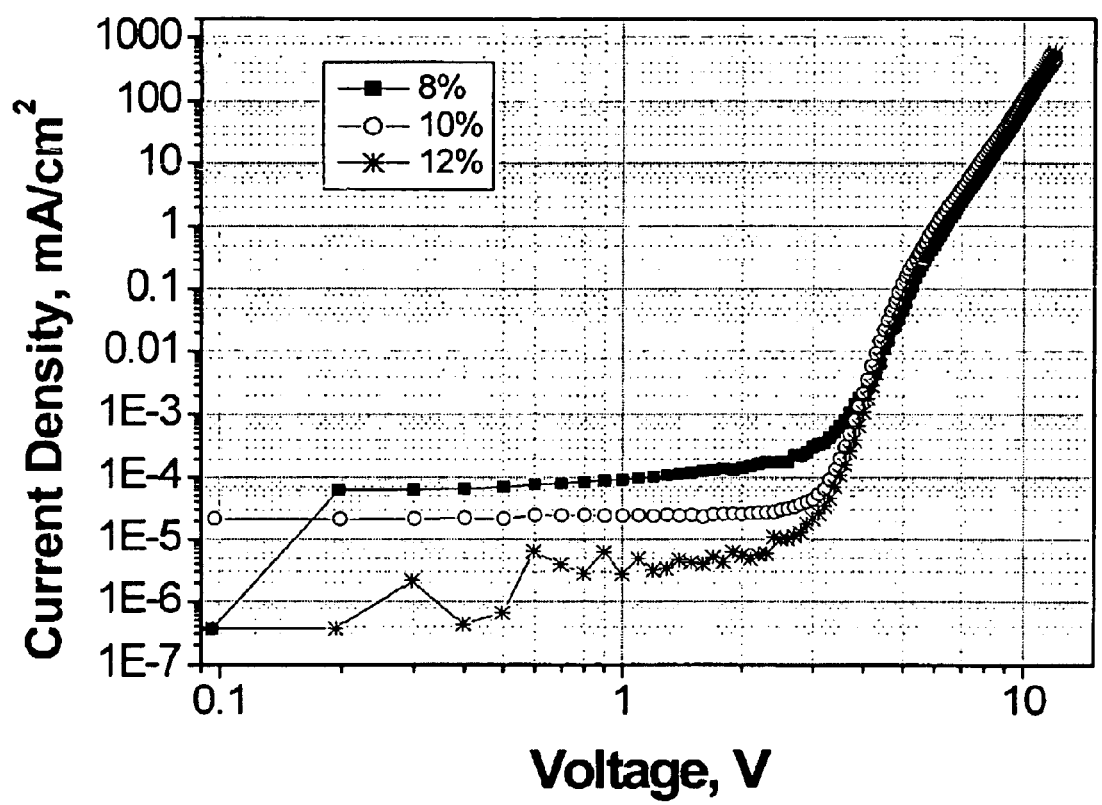
FIG. 12 shows the plot of current density vs. voltage for the FPt3 doped OLEDs: ITO/NPD (400 Å)/Ir(ppz) (200 Å)/CBP-FPt3 (300 Å)/BCP (150 Å)/Alq3 (200 Å)/Mg—Ag with various concentrations of FPt3.
Figure 13:
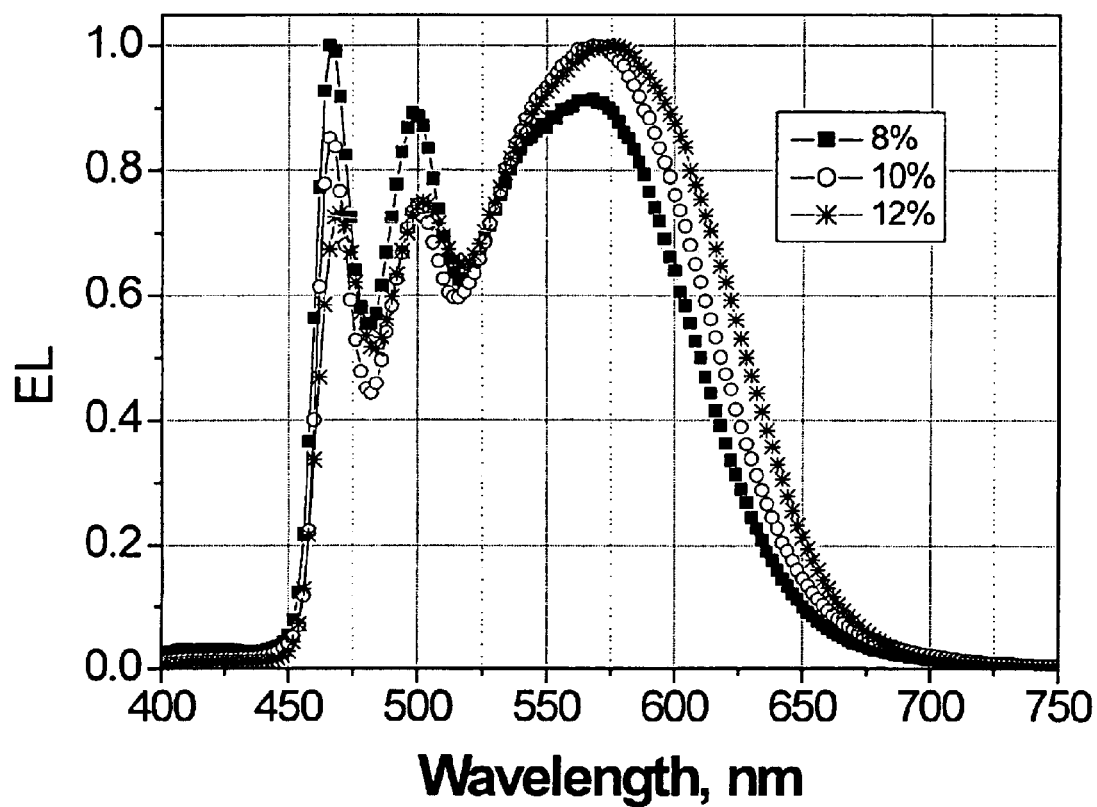
FIG. 13 shows the electroluminescent spectra of the FPt3 doped OLEDs of FIG. 12 at various concentrations of FPt3.
Figure 14:
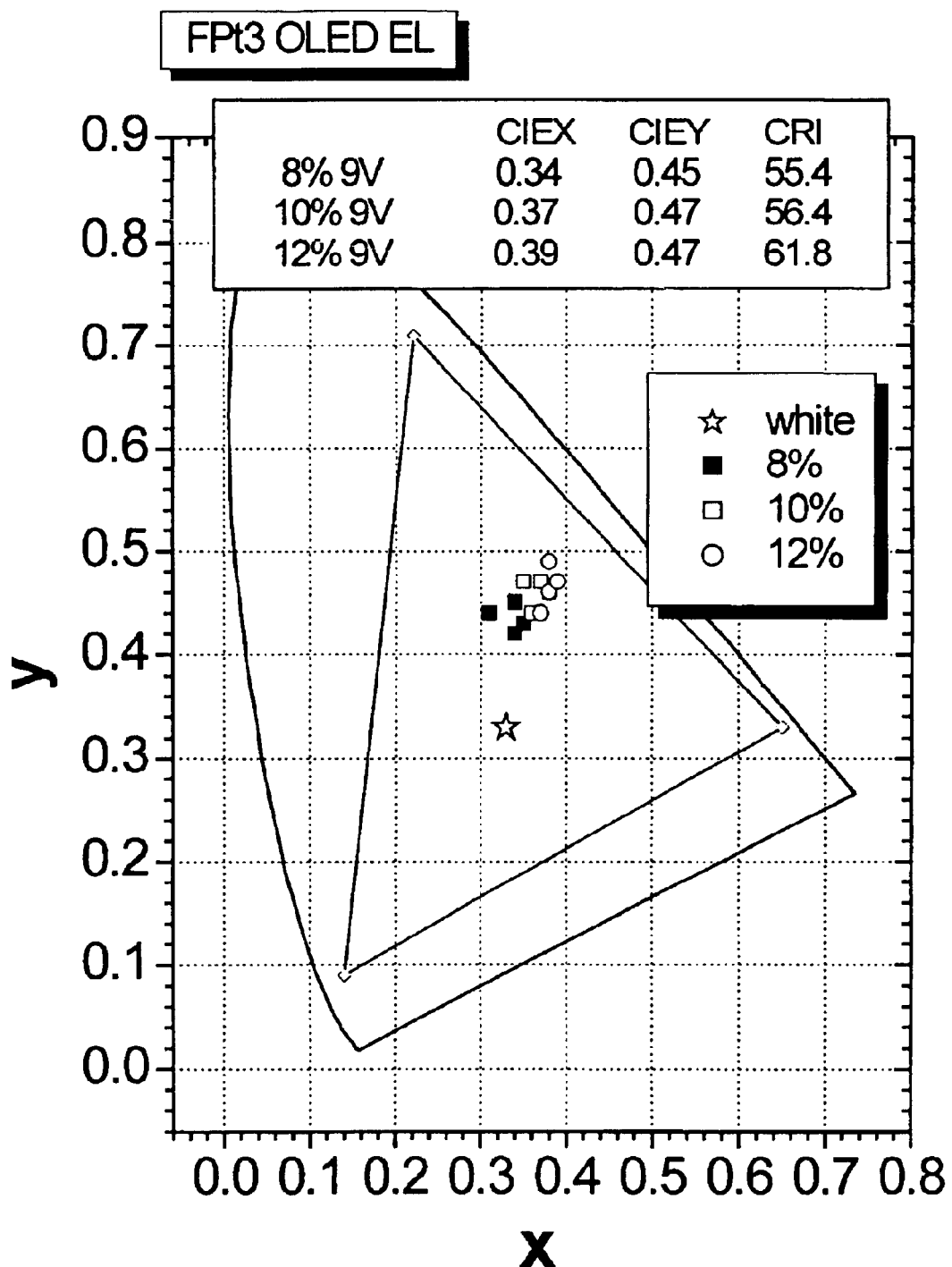
FIG. 14 shows CIE coordinates for the FPt3 doped OLEDs of FIG. 12 at various concentrations of FPt3.
Figure 15:
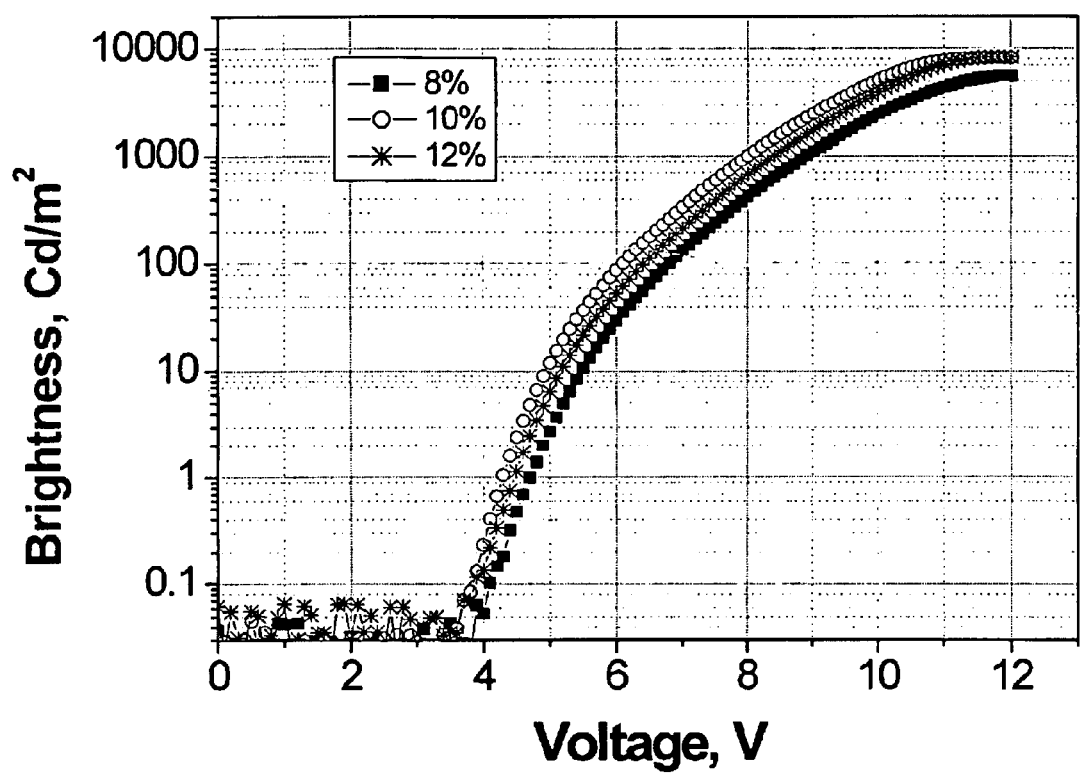
FIG. 15 shows the plot of brightness vs. voltage for the FPt3 doped OLEDs of FIG. 12 at various concentrations of FPt3.
Figure 16:
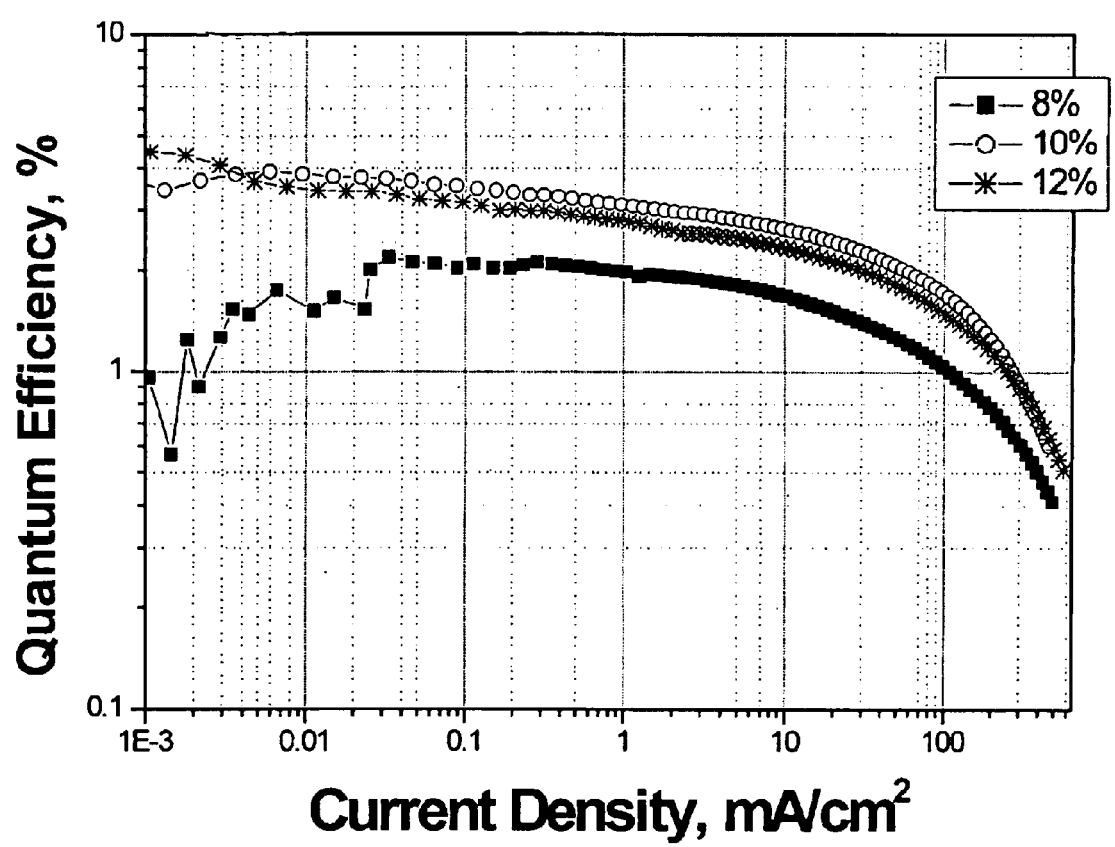
FIG. 16 shows the plot of quantum efficiency vs. current density for the FPt3 doped OLEDs of FIG. 12 at various concentrations of FPt3.
Figure 17:
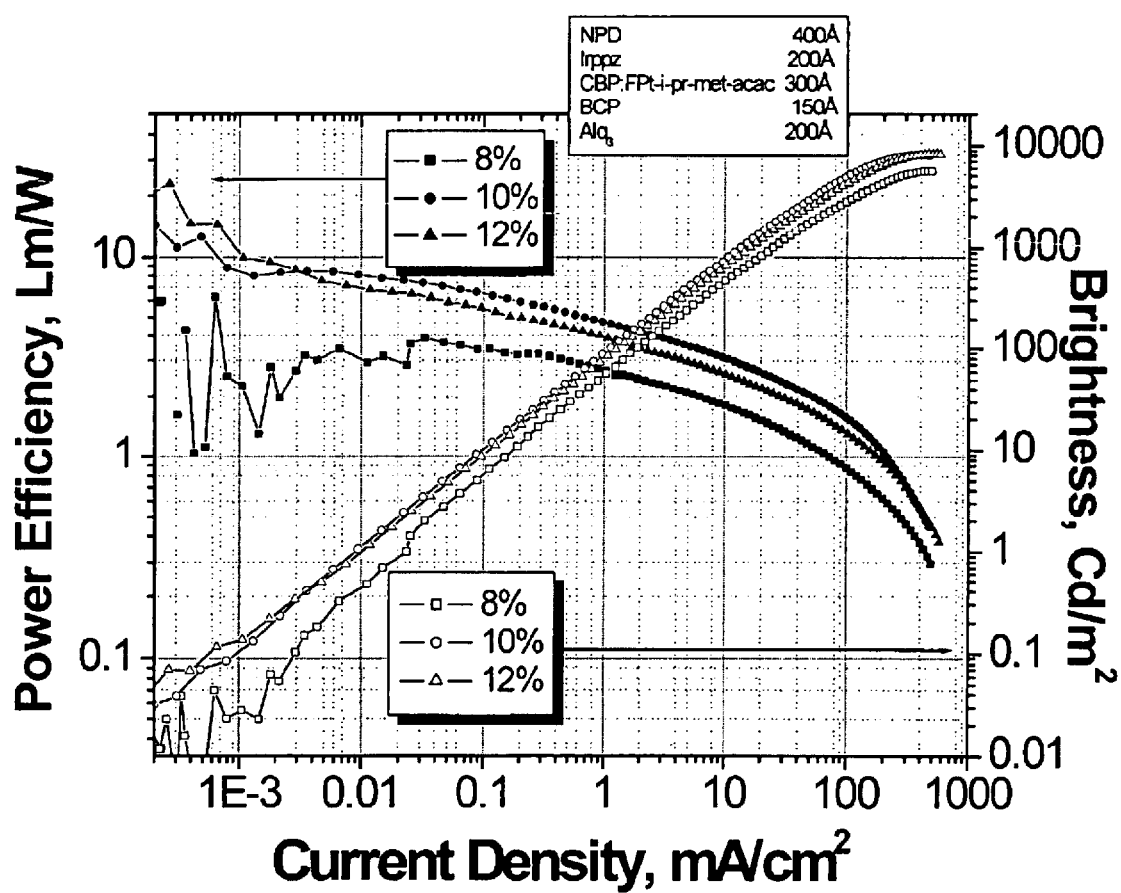
FIG. 17 shows the power efficiency and brightness as a function of current density for the FPt3 doped OLEDs of FIG. 12 at various concentrations of FPt3.
Figure 18:
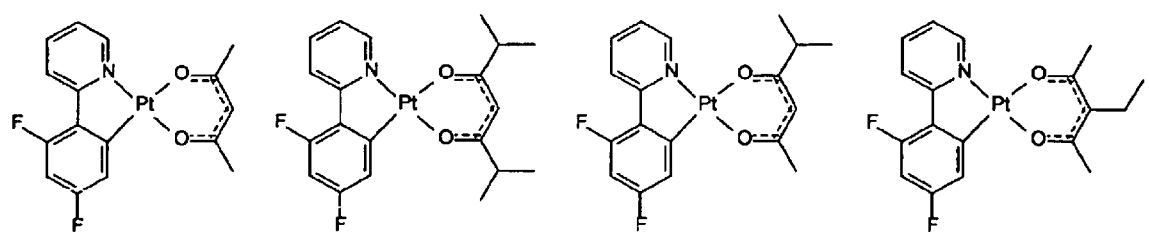
FIG. 18 shows the chemical structures of the compounds platinum (II) (2-(4',6'-difluorophenyl)pyridinato-N,$C^{2'}$) (2,4-pentanedionato) (FPt, FPt(acac)), platinum (II) (2-(4', 6'-difluorophenyl)pyridinato-N,$C^{2'}$) (2,2,6,6-tetramethyl-3, 5-heptanedionato) (FPt2), platinum (II) (2-(4',6'-difluorophenyl)pyridinato-N,$C^{2'}$) (6-methyl-2,4-heptanedionato) (FPt3), platinum (II) (2-(4',6'-difluorophenyl)pyridinato-N,$C^{2'}$) (3-ethyl-2,4-pentanedionato) (FPt4), iridium-bis(4,6,-$F_2$-phenyl-pyridinato-N,$C^2$)-picolinate (FIrpic), and fac-Iridium (III) tris(1-phenylpyrazolato-N,$C^{2'}$) (Irppz).
Figure 18:
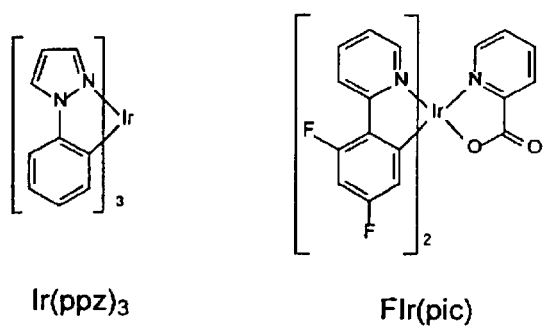
Figure 19:
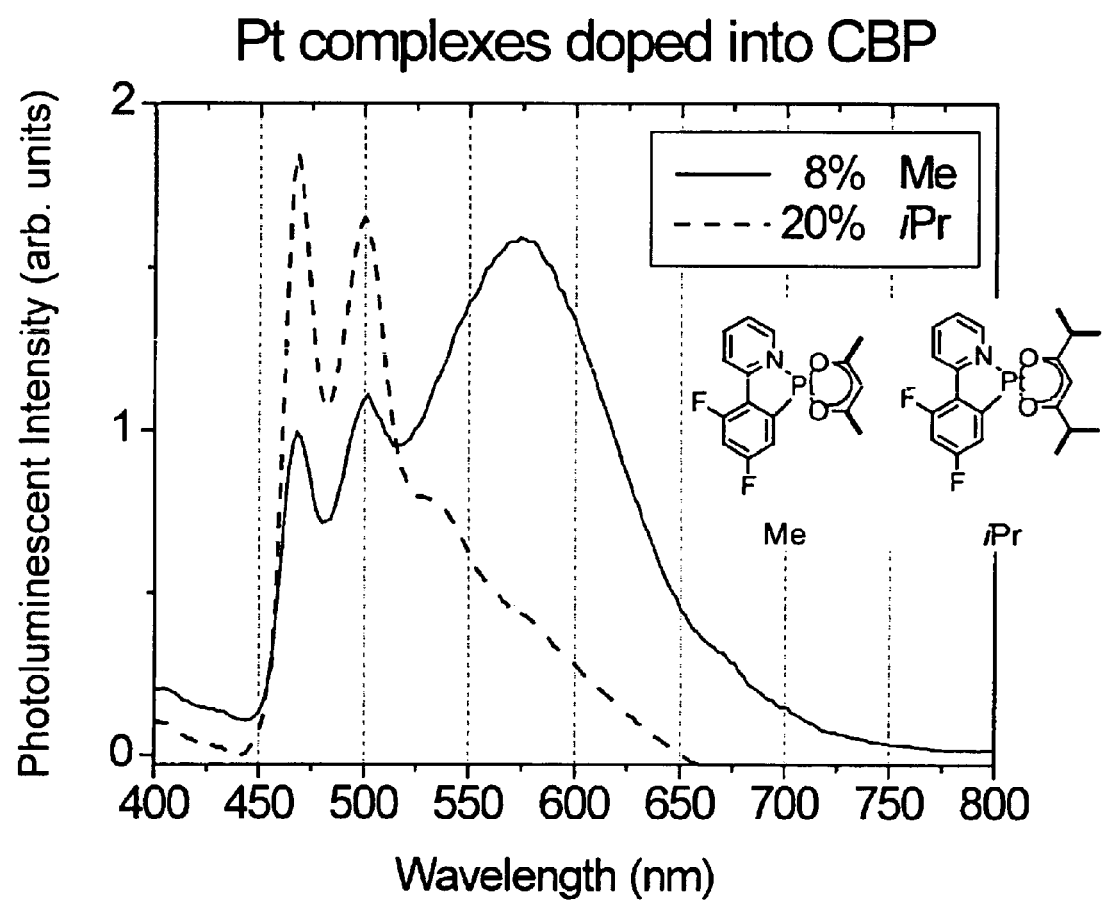
FIG. 19 shows the photoluminescence spectra of CBP films doped separately with 8% FPt (labeled "Me") and 20% FPt2 (labeled "iPr"). The greater steric bulk of the FPt2 complex inhibits aggregate formation in CBP, in contrast to the 8% FPt doped CBP, which shows a broad aggregate emission.

When the steric bulk of the emitter is increased, the likelihood that an excimer can be formed in the solid state is decreased. The added bulk prevents the molecules from associating closely. This is readily seen in the spectra of FPt2 (FIG. 9). The t-Bu groups of the complex prevent close face-to-face packing of these molecules in the doped films. As a result, only monomer emission is observed in the photoluminescence spectra of doped thin films of FPt2, at doping levels as high as 25%. FPt forms excimers too readily and FPt2 does not form excimers. When molecules with intermediate levels of steric bulk are used, it is possible to achieve mixed monomer/excimer emission at moderate doping levels. The role of added steric bulk is clearly seen in the photoluminescence spectra of thin films of FPt3 (FIG. 10) and Fpt4 (FIG. 11). At lower doping levels, monomer emission is observed and at high doping levels excimer emission is dominant. At close to 10% doping, closely balanced monomer-excimer emission for both of these complexes is observed. At lower doping levels, a large contribution from the host may be observed. As the doping level is increased the host contribution decreases as expected for more efficient exciton transfer at higher doping levels.

In another representative embodiment, the device is prepared from two different emissive materials so that one emits blue light from monomeric excited states. The other dopant emits from an excimeric state, leading to broad yellow emission. For example, a device that was prepared to demonstrate this concept utilized a blue emissive octahedral Ir complex, FIrpic, which does not form excimeric states at any doping level. The other dopant used in the device was a planar Pt complex, FPt, which efficiently forms excimeric states, even at low doping levels. When each of the dopants was present at 6%, the resulting electroluminescent emission consisted of roughly equal contributions from FIrpic (monomer) and FPt excimers.

Whenever an exciplex emitter is used to provide the broad emission which spans the low energy portion of the visible spectrum, the emissive region of the device will be comprised of an exciplex and a monomer emitter. The luminescent materials that comprise the monomer and excimer may emit via fluorescence or phosphorescence. The monomer emitter will preferably be one that emits in the high energy (for example, blue or green) portion of the visible spectrum. The exciplex emitter provides a broad emission which spans the low energy portion of the visible spectrum. There is no absorption into this exciplex state, so there will be minimal energy transfer from the monomeric emitter to the exciplex. Thus, if a device is prepared, for example, with two blue-emitting phosphorescent materials, one which forms an exciplex with the matrix material and one which does not, a white device may be prepared. The exciplex could emit yellow and would not trap energy from the non-exciplex forming dopant, since the exciplex has no ground state absorption (the oscillator strength for absorption is zero, thus the Forster radius=0). Thus, the ratio of blue to yellow emission may be readily tuned by varying the ratio of the two emitters, without the complication of energy transfer form the blue emitter to the yellow one. An example of two such materials are FIrpic and FPt. The Ir complex does not form exciplexes and the Pt complex forms a yellow exciplex in a TAZ matrix. The electroluminescence spectra of the two devices and their sum are shown in FIG. 1. The Ir based device has a peak external efficiency of 6% and the Pt based device (exciplex emission) has an external efficiency of 4%. The two light sources summed give a white light source with a CRI of 82, comparable to some of the best illumination sources.

The monomer emitter, the emitter which is not involved in aggregate emission, may be chosen from among the high energy (e.g., blue) luminescent materials. The monomer emitter will typically be a luminescent compound with sufficient steric bulk to prevent the needed proximity in the solid state for the formation of aggregates at a particular concentration. Preferred monomeric emitters comprise organometallic transition metal complexes that have an octahedral coordination geometry, or that have a square planar geometry and have ligands of sufficient steric bulk to prevent aggregate formation.

The phosphorescent materials for use in the present device are typically organometallic compounds. The phosphorescent materials may be selected from organometallic compounds as taught in applications U.S. Ser. Nos. 08/980,986, filed Jun. 18, 2001, now U.S. Pat. No. 6,303,238, and 09/978,455, filed Oct. 16, 2001, each of which is incorporated herein in its entirety by reference.

Various compounds have been used as HTL materials or ETL materials. The ETL materials may include, in particular, an aryl-substituted oxadiazole, an aryl-substituted triazole, an aryl-substituted phenanthroline, a benzoxazole or a benzothiazole compound, for example, 1,3-bis(N,N-t-butyl-phenyl)-1,3,4-oxadiazole (OXD-7); 3-phenyl-4-(1'-naphthyl)-5-phenyl-1,2,4-triazole (TAZ); 2,9-dimethyl-4,7-diphenyl-phenanthroline (bathocuproine or BCP); bis(2-(2-hydroxyphenyl)-benzoxazolate)zinc; or bis(2-(2-hydroxyphenyl)-benzothiazolate)zinc; such as disclosed in C. Adachi et al., *Appl. Phys. Lett.*, vol. 77, 904 (2000). Other electron transporting materials include (4-biphenyl)(4-tertbutylphenyl)oxadiazole (PDB) and aluminum tris(8-hydroxyquinolate) (Alq3).

The material of a hole transporting layer is selected to transport holes from an anode to an emission region of the device. HTL materials mostly consist of triaryl amines in various forms which show high hole mobilities ($\sim 10^{-3}$ cm$^2$/Vs). An example of a material suitable as a hole transporting layer is 4,4'-bis[N-(naphthyl)-N-phenyl-amino] biphenyl ($\alpha$-NPD) with a hole mobility of about $5\times 10^{-4}$ cm$^2$/V sec. Other examples include N,N'-bis(3-methylphenyl) -N,N'-diphenyl-[1,1'-biphenyl]4,4'-diamine (TPD), 4,4'-bis[N-(2-naphthyl)-N-phenyl-amino]biphenyl ($\beta$-NPD), 4,4'-bis[N,N'-(3-tolyl)amino]-3,3'-dimethylbiphenyl (M14), 4,4',4"-tris(3) methylphenylphenylamino)triphenylamine (MTDATA), 4,4'-bis[N,N'-(3-tolyl)amino]-3,3'-dimethylbiphenyl (HMTPD), 3,3'-Dimethyl-N$^4$,N$^4$,N$^{4'}$,N$^{4'}$-tetra-p-tolylbiphenyl-4,4'-diamine (R854), N,N'-meta-dicarbazoloylbenzene (mCP), N,N',N"-1,3,5-tricarbazoloylbenzene (tCP) and 4,4'-N,N'-dicarbazole-biphenyl (CBP). Additional suitable hole transporting materials are known in the art, and examples of materials that may be suitable for the hole transporting layer can be found in U.S. Pat. No. 5,707,745, which is incorporated herein by reference.

In addition to the small molecules discussed above, the matrix may comprise a polymer or polymer blend. In one embodiment, the emissive material(s) are added as a free molecule, i.e. not bound to the polymer, but dissolved in a polymer "solvent". A preferred polymer for use as a matrix material is poly(9-vinylcarbazole) (PVK). In an alternative embodiment, the emitter is part of the repeating unit of the polymer, for example Dow's polyfluorene materials. Both fluorescent and phosphorescent emitters may be appended to polymer chains and used to make OLEDs. Layers in a device comprising a polymeric matrix are typically deposited by spin-coating.

Suitable electrode (i.e., anode and cathode) materials include conductive materials such as a metal, a metal alloy or an electrically conductive oxide such as ITO, which are connected to electrical contacts. The deposition of electrical contacts may be accomplished by vapor deposition or other suitable metal deposition techniques. These electrical contacts may be made, for example, from indium, magnesium, platinum, gold, silver or combinations such as Ti/Pt/Au, Cr/Au or Mg/Ag.

When depositing the top electrode layer (i.e., the cathode or the anode, typically the cathode), that is, the electrode on the side of the OLED furthest from the substrate, damage to the organic layers should be avoided. For example, organic layers should not be heated above their glass transition temperature. Top electrodes are preferably deposited from a direction substantially perpendicular to the substrate.

The electrode that functions as the anode preferably comprises high work function metals ($\geq 4.5$ eV), or a transparent electrically conductive oxide, such as indium tin oxide (ITO), zinc tin oxide, or the like.

In preferred embodiments, the cathode is preferably a low work function, electron-injecting material, such as a metal layer. Preferably, the cathode material has a work function that is less than about 4 electron volts. The metal cathode layer may be comprised of a substantially thicker metal layer if the cathode layer is opaque. If the cathode is intended to be transparent, a thin low-work function metal may be used in combination with a transparent electrically conductive oxide, such as ITO. Such transparent cathodes may have a metal layer with a thickness of 50–400 Å, preferably about 100 Å. A transparent cathode, such as LiF/Al may also be used.

For top-emitting devices, a transparent cathode such as disclosed in U.S. Pat. No. 5,703,436, or patent applications U.S. Ser. Nos. 08/964,863, now U.S. Pat. No. 6,469,437, and 09/054,707, now U.S. Pat. No. 6,420,031, each incorporated herein by reference, may be used. A transparent cathode has light transmission characteristics such that the OLED has an optical transmission of at least about 50%. Preferably, the transparent cathode has light transmission characteristics that permit the OLED to have an optical transmission of at least about 70%, more preferably, at least about 85%.

The devices of the present invention may comprise additional layers, such as an exciton blocking layer (EBL), a hole blocking layer (HBL) or a hole injection layer (HIL). One embodiment of the invention uses an exciton blocking layer that blocks exciton diffusion so as to improve overall device efficiency, such as disclosed in U.S. Pat. No. 6,097,147, which is incorporated herein in its entirety by reference.

In still other embodiments of the invention, a hole injecting layer may be present between the anode layer and the hole transporting layer. The hole injecting materials of the present invention may be characterized as materials that planarize or wet the anode surface so as to provide efficient hole injection from the anode into the hole injecting material. The hole injecting materials of the present invention are further characterized as having HOMO energy levels that favorably match up, as defined by their relative IP energies, with the adjacent anode layer on one side of the HIL layer and the emitter-doped electron transporting layer on the opposite side of the HIL. The highest occupied molecular orbital (HOMO) obtained for each material corresponds to its ionization potential (IP). The lowest unoccupied molecular orbital (LUMO) is equal to the IP plus the optical energy gap, as determined from absorption spectra. Relative alignments of the energies in the filly assembled devices may differ somewhat from those predicted, for example from the absorption spectra.

The HIL materials, while still being hole transporting materials, are distinguished from conventional hole transporting materials that are typically used in the hole transporting layer of an OLED in that such HIL materials have a hole mobility that may be substantially less than the hole mobility of conventional hole transporting materials. For example, m-MTDATA has been identified as effective in promoting injection of holes from ITO into the HTL consisting of, for example α-NPD or TPD. Possibly, the HIL effectively injects holes due to a reduction of the HTL HOMO level/ITO offset energy, or to wetting of the ITO surface. The HIL material m-MTDATA is believed to have a hole mobility of about $3 \times 10^{-5}$ cm$^2$/V sec as compared with a hole mobility of about $5 \times 10^{-4}$ cm$^2$/V sec and $9 \times 10^{-4}$ cm$^2$/V sec of α-NPD and TPD, respectively. Thus, the m-MTDATA material has a hole mobility more than an order of magnitude less than the commonly used HTL materials α-NPD and TPD.

Other HIL materials include phthalocyanine compounds, such as copper phthalocyanine, or still other materials, including polymeric materials such as poly-3,4-ethylenedioxythiophene (PEDOT) or poly(ethene-dioxythiophene):poly(styrene sulphonic acid) (PEDOT:PSS) which are effective in promoting injection of holes from the anode into the HIL material and subsequently into the HTL.

The thickness of the HIL of the present invention needs to be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

Substrates according to the present invention may be opaque or substantially transparent, rigid or flexible, and/or plastic, metal or glass. Although not limited to the thickness ranges recited herein, the substrate may be as thin as 10 mm if present as a flexible plastic or metal foil substrate, or substantially thicker if present as a rigid, transparent or opaque substrate, or if the substrate is made of silicon.

The OLEDs and OLED structures of the present invention optionally contain additional materials or layers depending on the desired effect, such as protective layers (to protect certain materials during the fabrication process), insulating layers, reflective layers to guide waves in certain directions, and protective caps, which cover the electrodes and organic layers in order to protect these layers from the environment. A description of insulating layers and protective caps is contained for example, in U.S. Pat. No. 6,013,538, which is incorporated herein by reference.

Although a high CRI value is often preferred, the devices of the present invention may be used to produce a light source that provides other colors as well. Incandescent bulbs are actually slightly yellow, rather than pure white. By changing the ratio of monomer emitter to aggregate emitter, as described herein, the color of the resulting device can be tuned, for example, to imitate the light emitted from an incandescent bulb. By adjusting the concentration of a dopant, the steric bulk of a dopant, and the host material used in the emissive layer, a device may be constructed that will provide an unsaturated (not monochromatic) colored emission.

There may be substantial variation of the type, number, thickness and order of the layers that are present, dependent on whether an inverted sequence of OLED layers is present, or whether still other design variations are used. Those with skill in the art may recognize various modifications to the embodiments of the invention described and illustrated herein. Such modifications are intended to be covered by the spirit and scope of the present invention. That is, while the invention has been described in detail with reference to certain embodiments, it will be recognized by those skilled in the art that there are other embodiments of the invention within the spirit and scope of the claims.

EXAMPLES

Example 1

The electrophosphorescent excimer WOLEDs were grown on a glass substrate precoated with an indium-tin-oxide (ITO) layer having a sheet resistance of 20-W/sq. Prior to organic layer deposition, the substrates were degreased in ultrasonic solvent baths and then treated with an oxygen plasma for 8 min. at 20 W and 150 mTorr. Poly(ethylene-dioxythiophene):poly(styrene sulphonic acid) (PEDOT:PSS), used to decrease OLED leakage current and to increase fabrication yield, was spun onto the ITO at 4000 rpm for 40s, and then baked in vacuum for 15 min at 120° C., attaining an approximate thickness of 40 nm. The hole transporting and host materials, as well as the two dopants were prepared by standard procedures (See Lamansky, S. et al., *Inorg. Chem.* 40, 1704–1711, 2001) and purified by thermal gradient vacuum sublimation. The molecular organic layers were sequentially deposited without breaking vacuum by thermal evaporation at a base pressure of $<8 \times 10^{-7}$ Torr.

Deposition began with a 30 nm-thick 4,4'-bis[N-(1-naphthyl)-N-phenylamino]biphenyl (α-NPD) hole transport layer (HTL), followed by a 30 nm thick emission region consisting of the blue emitting phosphors FIr(pic) and FPt(acac), both doped at 6 wt % into a 4,4'-N,N'-dicarbazole-biphenyl (CBP) host. The final organic layer deposited was 50 nm of bathocuproine (BCP). This layer serves as a hole and exciton blocking layer, and as an electron transport medium.

Figure 6:
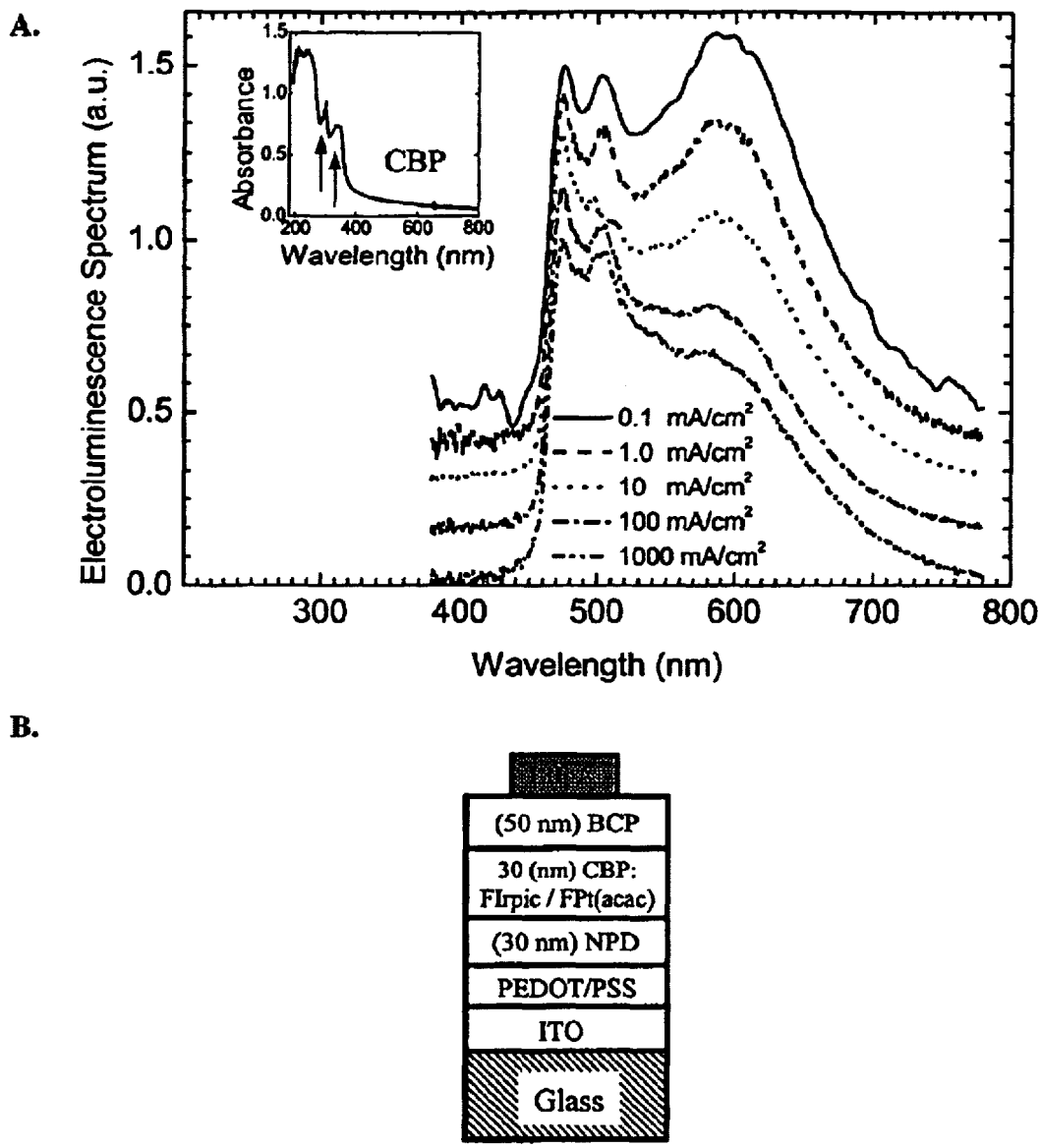
FIG. 6A shows the normalized electroluminescent spectra of the device ITO/PEDOT-PSS/NPD(30 nm)CBP:FIrpic 6%:FPt 6%(30 nm)/BCP(50 nm)/LiF at several current densities, staggered vertically for viewing clarity. The upper left inset shows the absorbance versus wavelength of a 1000 Å thick CBP film on quartz.
FIG. 6B depicts the structure of the device.

After deposition of the organic layers, the samples were transferred from the evaporation chamber into a N$_2$ filled glove box containing ≦1 ppm of H$_2$O and O$_2$. After affixing masks with 1 mm diameter openings to the samples, they were transferred into a second vacuum chamber ($<10^{-7}$ Torr) where the cathode metal (consisting of 5 Å of LiF followed by 70 nm of Al) was deposited through the masks. The samples were only exposed to air while being tested. A cross section of the device structure is shown in FIG. 6.

It is convenient to begin the design of the WOLED by examining the photoluminescence emission (PL) and excitation (PLE) spectra of the materials used in the device emissive region. Three doped films and an undoped "control" CBP film, each 1000 Å thick, were grown by thermal evaporation on separately solvent-cleaned quartz substrates.

Figure 5:
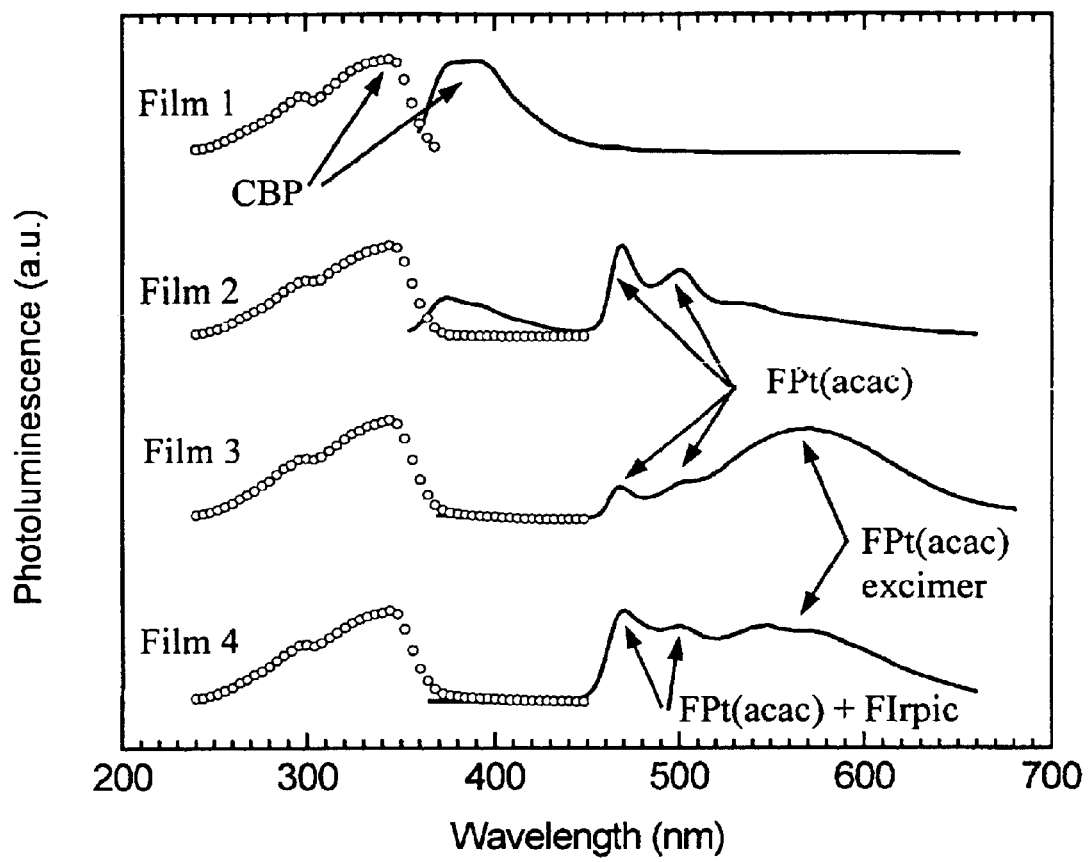
FIG. 5 shows the photoluminescence emission (solid lines) and excitation spectra (open circles) of Films 1–4. The films have a thickness of 1000 Å and are grown on quartz substrate. Film 1 shows the CBP PL spectrum with a peak at $\lambda=390$ nm and the corresponding PLE between $\lambda=220$- and 370 nm. The PLE of CBP has a shoulder at $\lambda=300$ nm and a main peak at $\lambda=350$ nm. The CBP PLE peaks correspond to the absorption peaks at $\lambda=300$- and 350 nm (arrows, inset of FIG. 6). These two CBP features appear in the PLE spectra of all films where CBP was used as a host; therefore, it is the main absorbing species in all the films, and energy must be transferring efficiently from CBP to both FPt(acac) and FIr(pic) for emission from these molecules to occur.

The PL and PLE spectra of the films were taken using a Photon Technology International QuantaMaster fluorescence system. FIG. 5 lists the composition of the films and their associated PL CIE coordinates.

FIG. 5 shows the PL (solid lines) and PLE (open circles) spectra of the films 1–4. Film 1 shows the CBP PL spectrum with a peak at $\lambda=390$ nm and the corresponding PLE between $\lambda=220$- and 370 nm. The PLE of CBP has a shoulder at $\lambda=300$ nm and a main peak at $\lambda=350$ nm. The CBP PLE peaks correspond to the absorption peaks at $\lambda=300$- and 350 nm (arrows, inset of FIG. 6). These two CBP features appear in the PLE spectra of all films where CBP was used as a host; therefore, it is the main absorbing species in all the films, and energy must be transferring efficiently from CBP to both FPt(acac) and FIr(pic) for emission from these molecules to occur.

The PL spectrum of Film 2 shows bands consistent with CBP and FPt(acac) monomer emission only. CBP emission is at $\lambda=390$ nm, and FPt(acac) monomeric emission has peaks at $\lambda=470$ nm and $\lambda=500$ nm (see FIG. 5). The spectrum observed for FPt(acac) in CBP is very similar to the same molecule in dilute solution. At <1 wt %, the randomly distributed FPt(acac) molecules are, on average, separated by 30 Å, precluding significant excimer formation. The lack of a broad, long wavelength peak in Film 2 suggests that exciplexes do not form between CBP and FPt(acac). That is, if exciplexes form between these moieties, exciplex emission from a FPt(acac)-CBP complex would be present even in the most lightly is doped samples.

As the FPt(acac) doping concentration is increased to ~7 wt % (Film 3), strong excimer emission is observed with an orange-red peak at $\lambda=570$ nm along with the characteristic monomer emission at $\lambda=470$ nm and $\lambda=500$ nm. The higher doping level leads to complete quenching of the CBP fluorescence. For Film 3, the measured lifetime of t=7.2 ms of the FPt(acac) emission at $\lambda=570$ nm, compared with 8.3 ms at $\lambda=470$ nm, is also consistent with excimer formation on FPt(acac) complexes.

Doping of FPt(acac) between 1 wt % and 7 wt % leads to spectra that are consistent with simultaneous monomer and excimer emission from the dopant. At a doping level of 3 wt %–4 wt % the monomer and excimer lines are balanced, leading to white emission. While this film composition could in principal be used to make a white OLED, the doping level is too low for the device to have a reasonable efficiency and give a spectrum free of CBP fluorescence.

Film 4 consists of CBP doped with 6 wt % FIr(pic) and 6 wt % FPt(acac). Here, CBP emission is absent in the PL, but the PLE spectrum still indicates that it is the main absorbing species, and that energy is efficiently transferred to both FIr(pic) and FPt(acac). The PL emission of the double-doped film is similar to the electroluminescence (EL) of the WOLED, shown in FIG. 6.

Figure 7:
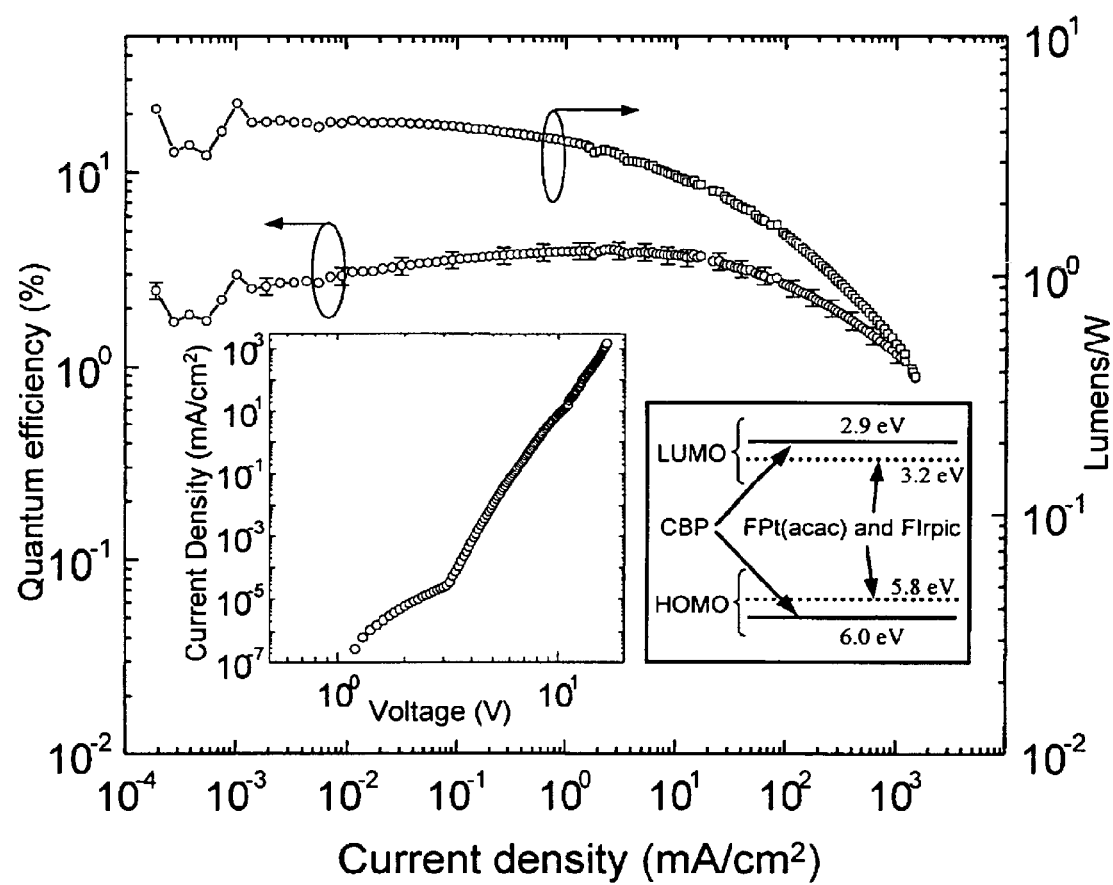
FIG. 7 shows the plots of external quantum and power efficiencies versus current density of the device ITO/PEDOT-PSS/NPD(30 nm)/CBP:FIrpic 6%:FPt 6%(30 nm)/BCP(50 nm)/LiF. The emissive layer consists of 6 wt % FIr(pic) and 6 wt % FPt(acac) doped into CBP. The left Inset shows the current-density versus voltage characteristics for this device. The right inset depicts the energy level diagram of CBP, shown with solid lines, doped with FIr(pic) and FPt(acac) (dashed lines). Here, HOMO indicates the position of the highest occupied molecular orbital and LUMO indicates the position of the lowest unoccupied molecular orbital.
Figure 8:
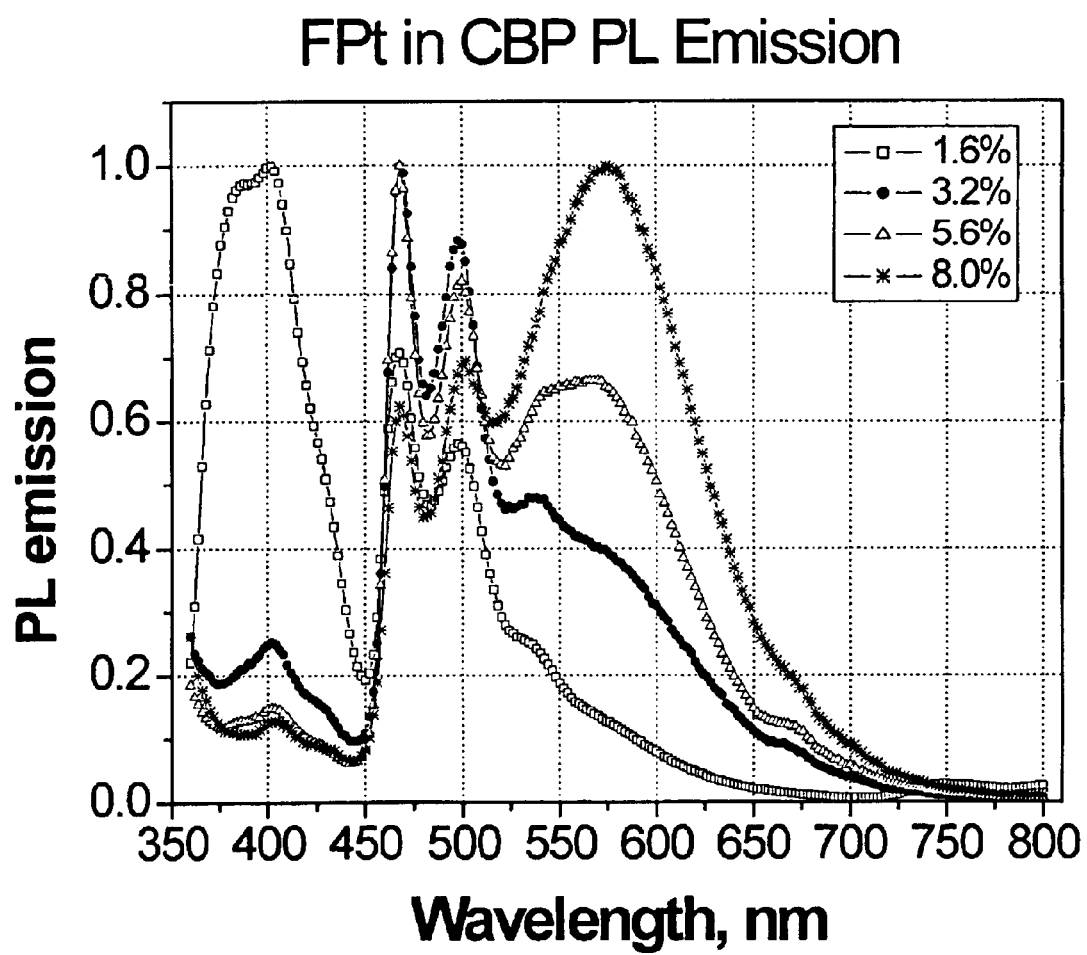
FIG. 8 shows the photoluminescence spectra of CBP films doped with varying levels of FPt.

The energy transfer process can be understood in the double-doped system by referring to the highest occupied molecular orbital (HOMO) and lowest unoccupied molecular orbital energies (LUMO) of the three organic components (lower right inset, FIG. 7). The transfer of triplet energy from CBP to FIr(pic) occurs via an endothermic process described by Adachi, C. et al., *Appl. Phys. Lett.* 79, 2082–2084 (2001). Assuming the same positions of the HOMO energy levels of (5.8±0.1 eV), and the LUMO energy levels of (3.2±0.1 eV) of both FPt(acac) and FIr(pic), a similar endothermic triplet energy transfer pathway can be expected for CBP and FPt(acac). Resonant energy transfer between the triplet levels of the two dopants is also likely since they are present at high concentration in the CBP matrix. However, direct energy transfer from FIr(pic) to the excimer can not occur because the excimer has zero ground state absorption, preventing the cascading of energy from the blue to the yellow emission centers. This essentially decouples the excited states of these molecules, allowing for simple optimization of the doping to achieve the desired color balance.

The light output power from the WOLED was measured using a Newport Power Meter and a calibrated silicon photo diode, and then calculated $\eta_{ext}$ using current density-voltage characteristics shown in the left inset of FIG. 7. A Lambertia intensity profile is assumed to calculate $\eta_p$ (FIG. 7) and luminance. Here, $\eta_{ext} \geq 3.0\%$ between $J=1\times10^{-3}$ mA/cm$^2$ and 10 mA/cm$^2$. The roll-off at J>300 mA/cm$^2$ is attributed to sample heating and triplet—triplet annihilation. The WOLED has a maximum $\eta_{ext}=(4.0\pm0.4)\%$ corresponding to (9.2±0.9)cd/A, a luminance of (31 000±3000) cd/m$^2$ at 16.6 V, $\eta_p=(4.4\pm0.4)$ lm/W and a CRI of 78.

A neat film of FPt(acac) has measured lifetimes of t=4.8 ms and 5.2 ms at $\lambda=470$ nm and $\lambda=600$ ms, respectively. Hence, as the current density increases, the FPt(acac) excimer states may become saturated compared to the monomer and FIr(pic) and lead to increased blue emission. The spectral changes reflect small changes in CIE coordinates from (0.40, 0.44) to (0.35, 0.43).

Example 2

OLEDs were prepared with FPt3 at doping levels of 8, 10 and 12%. The device structure consisted of ITO/NPD (400 Å)/Ir(ppz)$_3$ (200 Å)/CBP-FPt3 (300 Å)/BCP (150 Å)/Alq$_3$ (200 Å)/Mg—Ag. The current voltage characteristics of the three devices were similar, with progressively less leakage current at low voltage as the doping level is increased. The CBP host emission was not observed at any of the doping levels, indicating that the FPt3 dopant is efficiently trapping all of the excitons formed in the CBP matrix. While exciton formation in the CBP is a possible result of hole-electron recombination, it is also possible that the hole or electron could be trapped at the FPt3 molecule and direct recombination at the dopant occurs. The latter process will lead to excitons being formed on the dopant, without requiring energy transfer from the matrix material, i.e. CBP in this case. The Ir(ppz)$_3$ electron blocking layer was necessary to prevent electron leakage into the NPD layer, which leads to NPD emission in addition to dopant monomer-excimer emission. The three devices all show turn-on voltage between 3 and 4 volts and achieve maximum luminances between 4,000 and 10,000 Cd/m$^2$. The spectra of the devices show very little variation as the voltage is raised, i.e. the monomer to excimer ratio is not significantly affected by voltage or current density. The 10 and 12% doped devices give peak efficiencies of 4 and 3.5%, respectively. The 10 and 12% doped devices also give very good power efficiencies, of 8 and 6.5 lm/W, respectively (at 1 Cd/m$^2$).

While the present invention is described with respect to particular examples and preferred embodiments, it is understood that the present invention is not limited to these examples and embodiments. In particular, the present invention may be applied to a wide variety of electronic devices. The present invention as claimed therefore includes variations from the particular examples and preferred embodiments described herein, as will be apparent to one of skill in the art.

What is claimed is:

1. An organic light emitting device comprising an emissive layer, wherein the emissive layer comprises
   an aggregate emitter, and
   a monomer emitter
   wherein the aggregate emitter and/or the monomer emitter emit by phosphorescence, the emission from the aggregate emitter is lower in energy than the emission from the monomer emitter, and wherein the combined emission of the aggregate emitter and the monomer emitter sufficiently spans the visible spectrum to give a white emission.

2. The device of claim 1, wherein the aggregate emitter is an excimer.

3. The device of claim 1, wherein the aggregate emitter and the monomer emitter emit by phosphorescence.

4. The device of claim 3, wherein the aggregate emitter and the monomer emitter are comprised of the same chemical compound.

5. The device of claim 3, wherein the monomer emitter and aggregate emitter are phosphorescent organometallic compounds.

6. The device of claim 5, wherein the aggregate emitter comprises FPt(acac) and the monomer emitter comprises FIr(pic).

7. The device of claim 1, wherein the combined emission has a color rendering index of at least about 80.

8. The device of claim 1, wherein the combined emission has a CIE x-coordinate of about 0.30 to about 0.40 and a CIE y-coordinate of about 0.30 to about 0.45.

9. The device of claim 1, wherein the emissive layer comprises an exciplex emitter and a monomer emitter.

10. The device of claim 9, wherein the exciplex emitter and the monomer emitter emit by phosphorescence.

11. The device of claim 10, wherein the monomer emitter and exciplex emitter are phosphorescent organometallic compounds.

12. The device of claim 1, wherein the emissive layer further comprises a polymeric matrix.

13. The device of claim 12, wherein the polymeric matrix is PVK.

14. A lighting source incorporating a device of claim 1.

15. An organic light emitting device comprising
    an anode;
    a hole transporting layer;
    an electron transporting layer; and
    a cathode;
    wherein the hole transporting layer or the electron transporting layer is an emissive layer, the emissive layer comprises an aggregate emitter and a monomer emitter, the agaregate emitter and/or the monomer emitter emit by phosphorescence, the emission from the aggregate emitter is lower in energy than the emission from the monomer emitter, and wherein the combined emission of the aggregate emitter and the monomer emitter sufficiently spans the visible spectrum to give a white emission.

16. The device of claim 15, wherein the hole transporting layer is an emissive layer.

17. The device of claim 15, wherein the electron transporting layer is an emissive layer.

18. The device of claim 15, wherein the aggregate emitter is an excimer.

19. The device of claim 15, wherein the aggregate emitter and the monomer emitter emit by phosphorescence.

20. The device of claim 19, wherein the aggregate emitter and the monomer emitter are comprised of the same chemical compound.

21. The device of claim 19, wherein the aggregate emitter and the monomer emitter are phosphorescent organometallic compounds.

22. The device of claim 21, wherein the aggregate emitter comprises FPt(acac) and the monomer emitter comprises FIr(pic).

23. The device of claim 15, wherein the combined emission has a color rendering index of at least about 80.

24. The device of claim 15, wherein the combined emission has a CIE x-coordinate of about 0.30 to about 0.40 and a CIE y-coordinate of about 0.30 to about 0.45.

25. The device of claim 15, wherein the emissive layer comprises an exciplex emitter and a monomer emitter.

26. The device of claim 25, wherein the exciplex emitter and the monomer emitter emit by phosphorescence.

27. The device of claim 25, wherein the monomer emitter and exciplex emitter are phosphorescent organometallic compounds.

28. The device of claim 15, wherein the emissive layer further comprises a polymeric matrix.

29. The device of claim 28, wherein the polymeric matrix is PVK.

30. The device of claim 15, wherein the device further comprises an exciton blocking layer.

31. The device of claim 15, wherein the device further comprises a hole injection layer.

32. An organic light emitting device comprising
    an anode;
    a hole transporting layer;
    an emissive layer,
    an electron transporting layer, and
    a cathode;
    wherein the emissive layer comprises an aggregate emitter and a monomer emitter, wherein the aggregate emitter and/or the monomer emitter emit by phosphorescence, the emission from the aggregate emitter is lower in energy than the emission from the monomer emitter, and wherein the combined emission of the aggregate emitter and the monomer emitter sufficiently spans the visible spectrum to give a white emission.

33. The device of claim 32, wherein the emissive layer comprises an excimer emitter and a monomer emitter.

34. The device of claim 32, wherein the aggregate emitter and the monomer emitter emit by phosphorescence.

35. The device of claim 34, wherein the aggregate emitter and the monomer emitter are comprised of the same chemical compound.

36. The device of claim 34, wherein the aggregate emitter and the monomer emitter are phosphorescent organometallic compounds.

37. The device of claim 36, wherein the aggregate emitter comprises FPt(acac)and the monomer emitter comprises FIr(pic).

38. The device of claim 32, wherein the combined emission has a color rendering index of at least about 80.

39. The device of claim 32, wherein the combined emission has a CIE x-coordinate of about 0.30 to about 0.40 and a CIE y-coordinate of about 0.30 to about 0.45.

40. The device of claim 32 wherein the aggregate emitter is an exciplex.

41. The device of claim 40, wherein the exciplex emitter and the monomer emitter emit by phosphorescence.

42. The device of claim 41, wherein the monomer emitter and exciplex emitter are phosphorescent organometallic compounds.

43. The device of claim 32, wherein the emissive layer further comprises a polymeric matrix.

44. The device of claim 43, wherein the polymeric matrix is PVK.

45. The device of claim 32, wherein the device further comprises an exciton blocking layer.

46. An organic light emitting device comprising an emissive layer, wherein the emissive layer comprises an aggregate emitter, and a monomer emitter wherein the emissive layer consists of a single layer, the aggregate emitter and/or the monomer emitter emit by phosphorescence, the emission from the aggregate emitter is lower in energy than the emission from the monomer emitter, and wherein the combined emission of the aggregate emitter and the monomer emitter sufficiently spans the visible spectrum to give a white emission.

47. The device of claim 46, wherein the aggregate emitter is an excimer.

48. The device of claim 46, wherein the aggregate emitter and the monomer emitter emit by phosphorescence.

49. The device of claim 48, wherein the aggregate emitter and the monomer emitter are comprised of the same chemical compound.

50. The device of claim 48, wherein the monomer emitter and aggregate emitter are phosphorescent organometallic compounds.

51. The device of claim 50, wherein the aggregate emitter comprises FPt(acac) and the monomer emitter comprises FIr(pic).

52. The device of claim 46, wherein the combined emission has a color rendering index of at least about 80.

53. The device of claim 46, wherein the combined emission has a CIE x-coordinate of about 0.30 to about 0.40 and a CIE y-coordinate of about 0.30 to about 0.45.

54. The device of claim 46, wherein the emissive layer comprises an exciplex emitter and a monomer emitter.

55. The device of claim 54, wherein the exciplex emitter and the monomer emitter emit by phosphorescence.

56. The device of claim 55, wherein the monomer emitter and exciplex emitter are phosphorescent organometallic compounds.

57. The device of claim 46, wherein the emissive layer further comprises a polymeric matrix.

58. The device of claim 57, wherein the polymeric matrix is PVK.

59. An organic light emitting device comprising an emissive layer, wherein the emissive layer comprises an excimer emitter, and a monomer emitter wherein the emissive layer consists of a single layer, the emission from the excimer emitter is lower in energy than the emission from the monomer emitter, and wherein the combined emission of the excimer emitter and the monomer emitter sufficiently spans the visible spectrum to give a white emission.

* * * * *

UNITED STATES PATENT AND TRADEMARK OFFICE
CERTIFICATE OF CORRECTION

PATENT NO. : 6,869,695 B2
DATED : March 22, 2005
INVENTOR(S) : Mark E. Thompson et al.

It is certified that error appears in the above-identified patent and that said Letters Patent is hereby corrected as shown below:

Column 11,
Line 67, change "film Unfortunately," to -- film. Unfortunately --.

Column 19,
Line 50, change "agaregate" to -- aggregate --.

Signed and Sealed this

Twenty-seventh Day of September, 2005

JON W. DUDAS
*Director of the United States Patent and Trademark Office*